United States Patent
Carsten

(10) Patent No.: US 6,597,210 B2
(45) Date of Patent: *Jul. 22, 2003

(54) APPARATUS AND METHOD FOR CONTROL AND DRIVING BJT USED AS CONTROLLED RECTIFIER

(76) Inventor: Bruce W. Carsten, 6410 NW. Sisters Pl., Corvallis, OR (US) 97330-9243

( * ) Notice: Subject to any disclaimer, the term of this patent is extended or adjusted under 35 U.S.C. 154(b) by 0 days.

This patent is subject to a terminal disclaimer.

(21) Appl. No.: 09/971,096

(22) Filed: Oct. 3, 2001

(65) Prior Publication Data

US 2003/0062931 A1 Apr. 3, 2003

(51) Int. Cl.$^7$ ............................................... H02M 7/217
(52) U.S. Cl. ...................................... 327/108; 363/127
(58) Field of Search ................................. 327/108, 530, 327/538, 534; 363/127, 98; 323/280, 313, 314, 315, 273, 224

(56) References Cited

U.S. PATENT DOCUMENTS

| | | | |
|---|---|---|---|
| 3,582,758 A | | 6/1971 | Gunn |
| 3,940,682 A | | 2/1976 | Park et al. |
| 4,239,989 A | * | 12/1980 | Brajder ...................... 307/255 |
| 4,254,372 A | * | 3/1981 | Moore ......................... 323/277 |
| 4,329,705 A | * | 5/1982 | Baker .......................... 357/43 |
| 4,495,537 A | * | 1/1985 | Laude .......................... 361/98 |
| 4,716,514 A | | 12/1987 | Patel |
| 4,940,906 A | * | 7/1990 | Gulczynski ................. 307/296 |
| 5,721,483 A | | 2/1998 | Kolluri et al. |
| 5,905,368 A | | 5/1999 | Kolluri et al. |
| 6,259,324 B1 | * | 7/2001 | Antognetti et al. ......... 330/296 |
| 6,373,339 B2 | * | 4/2002 | Antognetti et al. ......... 330/296 |

OTHER PUBLICATIONS

"A New Synchronous Rectifier Using Bipolar Junction Transistor Driven by Current Transformer", by Eiji Saki et al IEEE INTELEC Conference, 1992, pp. 424–429. No date.

"A New Closed Loop Adaptive Base Drive Scheme Minimizes Transistor Drive & Saturation Losses," W. E. Rippel, Powercon II Conference, 1984, Dallas, TX, section 6–1, pp. 1–13. No date.

"Isolation of Faulted Power Modules in Low Voltage DC Distributed/Redundant Power Systems," Bruce Carsten, PCIM/PQ Conference, (no date)

* cited by examiner

Primary Examiner—Rajnikant B. Patel
(74) Attorney, Agent, or Firm—Stephen J. Adamson

(57) ABSTRACT

A bipolar junction transistor (BJT) used as a controlled rectifier (CR) that is driven and controlled by an electronic circuit, such that when (in a first mode of operation) the collector-emitter voltage (VCE) is above an offset voltage (VCEOS) the circuit drives the base of the SR BJT with a base current proportional to the difference between VCE and VCEOS, turning the CR BJT on with a base current proportional to the collector current. When the VCE of the CR BJT falls below VCEOS the drive circuit turns on a second transistor coupled between the base and collector of the CR BJT to turn the CR BJT rapidly off and maintains it in the off state as the collector voltage reverses. When the VCE of the CR BJT exceeds a threshold voltage above the normal conduction VCE range, the control circuit increases the base drive current to accelerate the CR BJT turn-on process. A second mode of operation occurs in the presence of an "OFF" drive command to the CR, which turns the CR off when the collector voltage is above the emitter voltage. Turn off of the CR is now accomplished with a third transistor coupled between the base and emitter of the CR BJT.

30 Claims, 14 Drawing Sheets

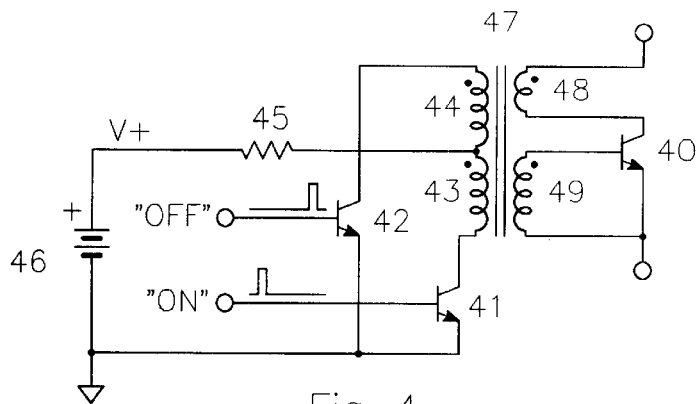
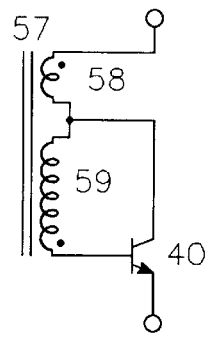
Fig. 4
PRIOR ART
Fig. 5
PRIOR ART
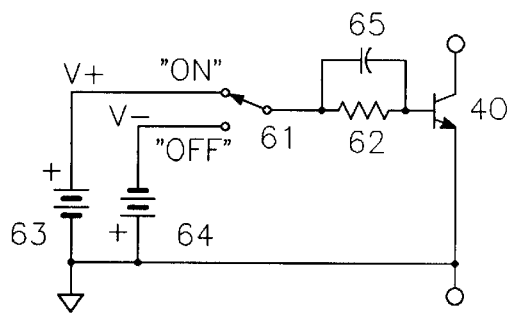
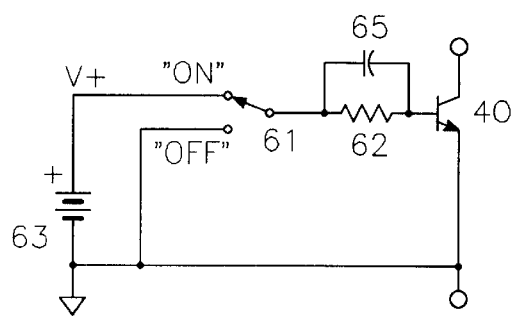
Fig. 6
PRIOR ART
Fig. 7
PRIOR ART
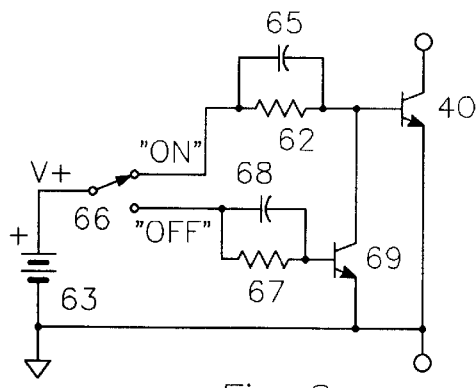
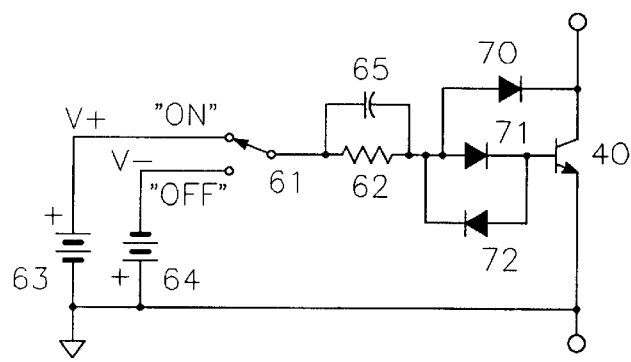
Fig. 8
PRIOR ART
Fig. 9
PRIOR ART Fig. 12A  DRIVE CIRCUIT USING VCE SENSED INPUT

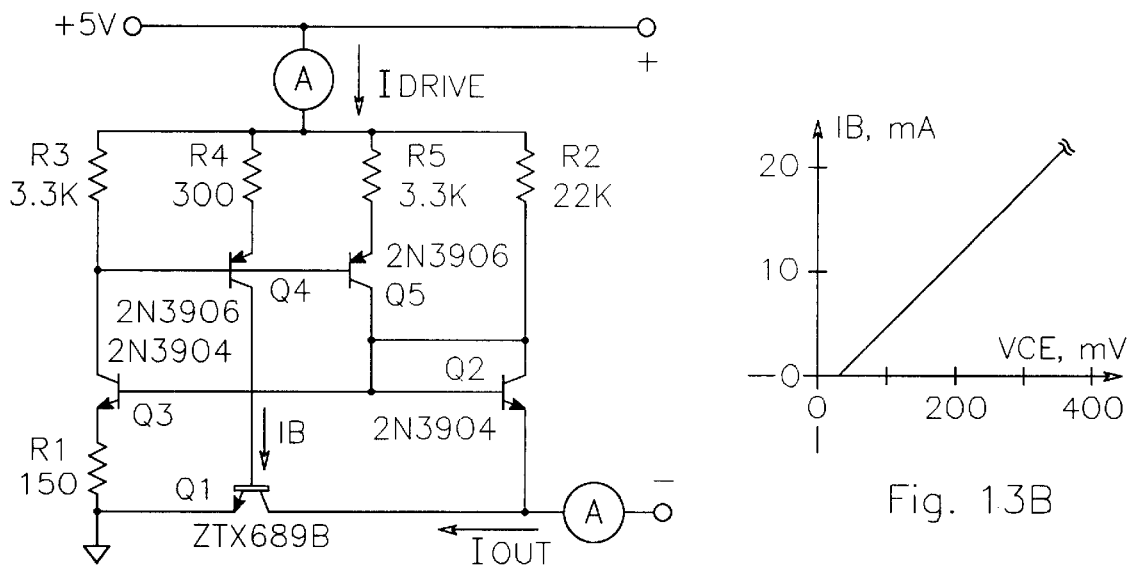
TEST CIRCUIT FOR BJT AS BLOCKING DIODE
Fig. 13A  PRIOR ART
Fig. 13B
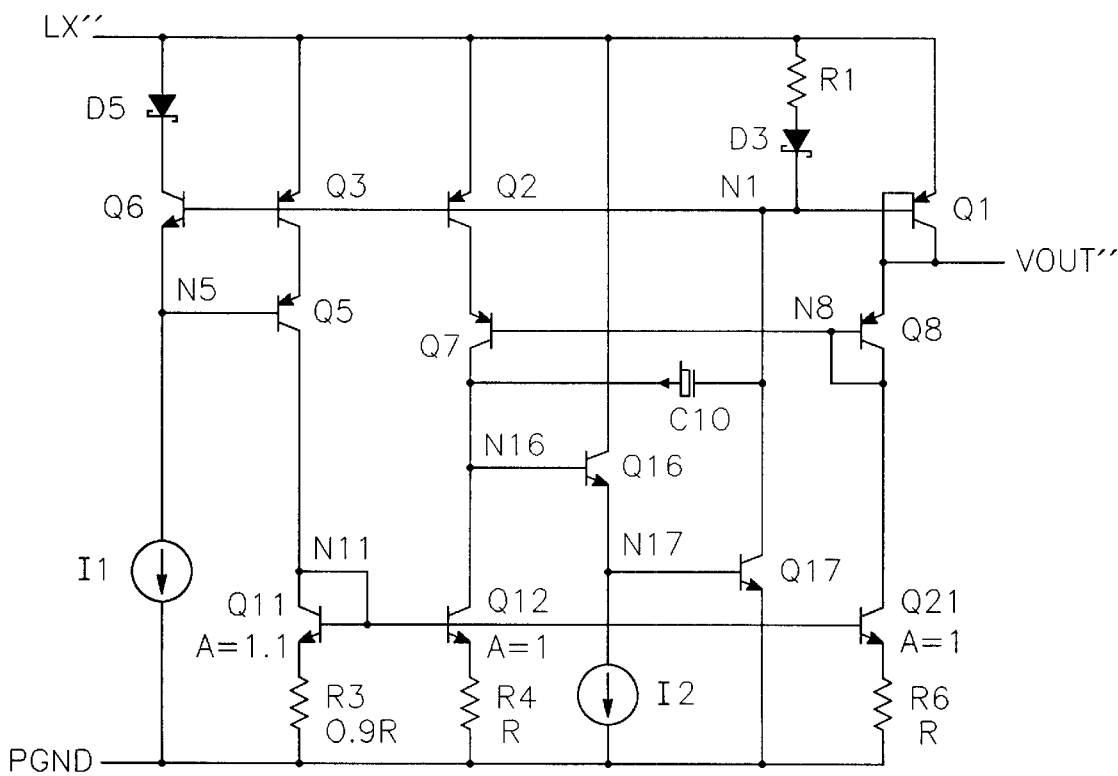
Fig. 14  PRIOR ART

APPARATUS AND METHOD FOR CONTROL AND DRIVING BJT USED AS CONTROLLED RECTIFIER

CROSS REFERENCE TO RELATED APPLICATIONS

This application is related to the following applications:

U.S. patent application having Ser. No. 09/971,047, filed Oct. 3, 2001, and entitled Apparatus and Method for Turning Off BJT used as Synchronous Rectifier (by the same inventor as herein) which is hereby incorporated by reference as though it were disclosed in its entirety herein.

U.S. patent application having Ser. No. 09/971,048, filed Oct. 3, 2001, and entitled Apparatus and Method for Turning Off BJT used as Controlled Rectifier (by the same inventor as herein) which is hereby incorporated by reference as though it were disclosed in its entirety herein.

U.S. patent application having Ser. No. 09/971,057, filed Oct. 3, 2001, and entitled Apparatus and Method for Control and Driving BJT used as Synchronous Rectifier (by the same inventor as herein) which is hereby incorporated by reference as though it were disclosed in its entirety herein.

FIELD OF THE INVENTION

The present invention relates to controlled rectifiers and, more specifically, to the efficient, economical and optimal driving and control of a bipolar junction transistor (BJT) used as a controlled rectifier (CR).

BACKGROUND OF THE INVENTION

To facilitate a better understanding of the present invention, the following information on the development of synchronous and controlled rectification and the operation of PN junction and bipolar semiconductor devices is presented.

DC to DC power converters are typically used to stabilize or isolate a power supply signal from upstream irregularities (i.e., voltage/power surges, momentary power outages, etc.). Various transformer and non-transformer based power converters are known in the art. These power converters typically employ a rectifying device to convert either a transformed AC signal, a chopped DC or a similar signal (depending on the power converter arrangement) into a DC output signal. This output DC signal constitutes a relatively stable power supply signal. Depending on the range of voltage (and current) for which the power converter is designed, the power converter may be used, for example, in power supplies for personal electronic devices, laptop or personal computers, engineering workstations and Internet servers. While the present invention is particularly concerned with electronic/digital logic circuits, it should be recognized that the teachings of the present invention are applicable to rectifying device operation in any voltage/current range and for any purpose.

For many years the standard power supply voltage level for electronic logic circuits was 5V. Recently, this voltage level has dropped in many instances to 3.3V and 2.5V, and there are plans within the industry to further reduce this voltage level. As this voltage level drops, however, the forward conduction voltage drop of the rectifying device becomes the dominant source of power loss and inefficiency. For example, a Schottky diode is typically used when a low voltage drop is desired, and a typical Schottky diode has a 500 mV forward voltage drop. This limits the theoretical efficiency of a DC to DC power converter to 80% at two volts output (before other power conversion losses are taken into account). This efficiency limit further drops to less than 67% at one volt output, and 50% at 500 mV output. These efficiency limits are deemed unacceptable.

In addition to concerns about forward voltage drop and other power inefficiencies, power converters and rectifying devices therein are expected to have high power densities. This mandates a higher switching frequency such that less energy is processed in each switching cycle, which in turn permits smaller component sizes. Switching frequencies have risen from 5 to 20 KHz thirty years ago (where the push was to get above the audible range) up to 100 KHz to 1 MHz at present. Thus, technology that does not support rapid switching is not preferred for most rectification applications.

With respect to known semiconductor rectifying devices, these include rectifying diodes (PN and Schottky junction in Si, GaAs, etc.) and rectifying transistors (bipolar and field effect). The forward voltage drop of a rectifying diode can be reduced by design, but only to around 300 mV to 200 mV before a point of diminishing returns is reached where increasing reverse leakage current losses outweigh the decreasing conduction losses. This is due to an inherent physical limit of rectifying diodes and does not depend on semiconductor material or whether the construction is that of a conventional P-N junction diode or a Schottky junction diode. For this reason, amongst others, diodes are not desirable as rectifying devices for low voltage level applications.

Rectifying transistors in which transistor driving is in "synchronism" with the direction of current flow across the transistor have increased in popularity due to their favorable forward voltage drops relative to diodes. Typically, the synchronous rectifying transistor is driven "on" to provide a low forward voltage drop when current flow across the rectifying transistor is in a designated forward direction, and is driven "off" to block conduction when current flow across the rectifying transistor would be in the opposite direction.

A controlled rectifier (CR) is typically achieved when a synchronous rectifier may be driven into an off state regardless of the direction of potential current flow across the rectifying transistor. Thus the "control" of a CR puts the rectifier into one of two states: a "normal" state where the device behaves as a synchronous (or conventional) rectifier, always conducting when current flow would be in a designated forward direction, and always blocking current flow in the reverse or opposite direction, and a second "forced off" state where the rectifier blocks current flow in either direction. Turning a CR off when a rectifier would normally conduct allows the average output voltage (or current) to be reduced, or controlled, by the CR. If the CR is allowed to conduct for only 50% of the time that a conventional or SR would conduct, e.g., the output voltage is reduced by half. The additional control achieved by replacing conventional or synchronous rectifiers with controlled rectifiers can be used to significant advantage in several applications.

In a DC to DC power converter with transformer isolation, control of output voltage is achieved by adjusting the switching times of the input side transistor switch or switches, which requires that the isolated output voltage information be sensed and fed back to the input side. Controlled rectification allows the input transistors to be switched at fixed times, while the conduction times of the CR on the output side are adjusted to regulate the output voltage, avoiding the need to send control information to the isolated input, which can reduce costs and/or improve performance.

Further advantages accrue with two or more output voltages from the same DC to DC converter. Conventional or SR allows only one output voltage to be fully regulated and current limited by controlling the input side transistor switching times; other outputs are at best "semi-regulated", and often require post-regulation by additional circuitry which increases costs and reduces efficiency. Furthermore, a separate transformer winding is required for each distinct output voltage. Controlled rectification allows each output voltage to be completely and independently controlled with maximum efficiency, and a single transformer output winding can be used for several similar output voltages, reducing costs. For example, a single winding might be used to simultaneously provide 5V, 3.3V and 2.5V outputs with individual CR.

Hybrid approaches are also possible. In the previous example, the 5V output may be regulated by control of the input side transistors, while the 3.3V and 2.5V outputs are derived from the same transformer output winding by CR.

Both the Bipolar Junction Transistor (BJT) and the Metal-Oxide-Semiconductor Field Effect Transistor (MOSFET) have been used as a synchronous rectifier transistor, also termed a "synchronous rectifier" (SR). Although the BJT has a longer history of use as an SR, the MOSFET is used almost exclusively at present due to its fast switching speed and perceived ease of driving. BJTs are little used at present due to slow switching speeds in general, and a slow turn-off in particular. However, the BJT has the ability to block current flow in either direction when in an off state, and thus may also be used as a controlled rectifier transistor, also termed a "controlled rectifier" (CR). The conventional power MOSFET can only block current flow in one direction, and thus cannot be used as a true CR.

The present invention recognizes that the BJT is a conductivity modulated device whereas the MOSFET is not. As a result of this distinction, the BJT can achieve a lower forward voltage drop for a given forward current density and reverse voltage blocking capability. Major technical costs of the lower voltage drop, however, are associated with the requirement to inject, maintain and remove the conductivity modulating stored charge. Nonetheless, the lower conduction voltage of the CR BJT could be used to advantage at lower output voltages, if the BJT switching speed (e.g., turn-off and turn-on) could be improved in a cost-effective and efficient manner (which as discussed below is a purpose, amongst others, of the present invention).

Furthermore, the present invention recognizes that an advantage of using a BJT as a controlled rectifier is that the average output voltage or current of an isolated power converter can be regulated from the output side by modulation of the CR conduction duty cycle. With multiple outputs, the voltage or current of each output can be independently controlled. Since the construction of conventional MOSFETs prevents their use as CRs, and BJTs are considered an obsolete technology for switching mode applications, the technique of controlled rectification to regulate output voltage or current is not widely known at present in the field of high frequency switching mode power conversion.

Though MOSFETs and BJTs have certain similarities in design and construction, they also have substantial differences that impact their behavior and the type of circuits that are suitable for driving them. In order to appreciate the drive requirements of a BJT, it is helpful to first consider the basic semiconductor structures from which most other semiconductor devices are built: the PN junction diode.

P-N Diode Construction and Operation

Semiconductor materials are nearly insulating in the pure state, but they may be doped with impurities to create mobile electric charges which improve their conductivity markedly. These impurities may be either "N" type (for "negative") which produces free electrons in the semiconductor material or "P" type (for "positive") which produces holes in the semiconductor material. The negatively charged free electrons are mobile, and will flow towards a positive charge and away from a negative charge. In P-type semiconductors, the "positive" charge carrier is the local deficiency of an electron, often referred to as a "hole," and holes are also considered to be mobile (much as an air bubble is mobile in water). Holes will flow in a direction opposite to that of electrons in the presence of an applied electric field. When no electric field is applied, mobile electrons and holes diffuse with no net flow in any direction.

FIG. 1A illustrates a representative P-N junction diode 1 formed by adjacent regions of equally doped P-type semiconductor 2 and N-type semiconductor 3. Conductive contacts for an anode (A) 4 and a cathode (K) 5 are made to regions 2 and 3, respectively. Diffusion of electrons and holes near the junction causes some to meet, recombine and neutralize each other; conceptually, the electrons fall into the holes. Fixed oppositely charged atoms are left behind, which produce a voltage field opposing further electron and hole flow towards the junction. A small region near the junction, often termed the "space charge layer," is left depleted of mobile charge carriers and the diode will carry essentially no current if small voltages are applied across the device.

FIG. 1B illustrates the P-N junction of FIG. 1A to which is applied a reverse biased voltage by voltage source 6. The negative terminal of the voltage source is connected to anode 4 and the positive terminal to cathode 5. This causes holes and electrons to move towards the oppositely charged electrodes and away from the junction, creating a larger depletion region. Only a small "leakage" current flows across this region and it is due to thermal (or radiation) generated electron-hole pairs.

FIG. 1C illustrates the same P-N junction exposed to a forward biased voltage by voltage source 7 and current limiting resistor 8. Both the holes and electrons can be thought of as being pushed towards the junction. When the forward junction voltage is greater than about 600 mV (for silicon), the depletion region is overcome and the holes and electrons cross over the junction in significant numbers. The electrodes replenish the supply of holes and electrons, and thus create a continuous forward current flow IF. For historical reasons, "current" is said to flow in the direction opposite to electron flow. Thus, the P-N junction diode allows current to flow in one direction but not in the other, and may be used to "rectify" and alternating current (AC) into a direct current (DC) which flows in only one direction.

FIGS. 2A–2B illustrate P-N junction diodes having unequal doping levels to achieve a higher reverse voltage capability. Diode 11 in FIG. 2A has a heavily doped "P+" region 12 and a lightly doped "N−" region 13. The lightly doped region has a significant electrical resistance, indicated by resistance symbol 14. The depletion region is much thicker in the N− than the P+ material, as equal charges must be drawn from both sides of the junction for recombination. This holds true when a reverse voltage is applied, as shown in FIG. 2B, and it is the much wider N− depletion region which sustains a higher reverse voltage before breakdown occurs. (Note that relative depletion region thickness is not shown to scale, typically differing by two to three orders of magnitude.) In FIG. 2C, diode 11 of FIG. 2A is shown with an applied forward biased voltage. This diode initially has a higher "forward recovery" conduction voltage than that of diode 1 (FIG. 1C) due to the voltage drop through resistance

14. The relative hole and electron currents crossing the junction are proportional to the relative doping levels, however, so there are far more holes flowing from the P+ region into the N− region than electrons flowing the other way. This heavy injection of holes into the lightly doped N− region attracts an equal number of electrons to maintain overall charge neutrality, creating a highly conductive electron-hole plasma which lowers the resistance of the lightly doped region dramatically. This conductivity modulation of resistance 14 causes the forward voltage drop to quickly approach that of diode 1 in FIG. 1C. However, the stored charge in the N− region must be removed by electron-hole recombination or a momentary reverse current flow, before reverse voltage blocking with low leakage currents can again be achieved.

BJT Construction and Operation

The semiconductor structure of an NPN BJT is that of two back-to-back PN junction as shown in FIG. 3A. The power BJT 31 of FIG. 3A has an N+ emitter region 32, a central P doped base 33, and an N− collector region 34. Conductive electrodes 35–37 connect to the emitter, collector and base regions, respectively.

In FIGS. 3B and 3C, BJT 31 is driven to conduct a collector current (IC) with a base current (IB) from an adjustable current source 38. A current limited voltage source 39 provides a forward bias from collector to emitter. Various regions of operation of BJT 31 are illustrated in FIG. 3D, where the collector-emitter voltage (VCE) and IC are plotted as a function of IB.

In the "linear" region of operation, where the collector voltage is well above the base voltage, the base current largely consists of holes (H) flowing from the base region into the emitter (FIG. 3B). The emitter is far more heavily doped than the base, causing a much larger current of electrons (E) to flow from the emitter back into the base. The base region is made very thin, however, and most of these electrons pass through the base region and into the collector, causing a collector current to flow, which is much larger than the base current. Some of the electrons from the emitter recombine with holes in the base, and a small extra base current flows to resupply these holes. An electron-hole plasma also forms in the base region and results in a small stored charge, but these and related effects are generally of minor importance in switching applications and will be ignored. In the linear region of operation, IC is essentially proportional to IB until the current limit point of voltage source 39 is reached, where VCE then falls very quickly for a small increase in IB, as shown in the left portion of FIG. 3D. The current gain "β" of a BJT is the ratio of IC/IB in the linear region of operation.

For the BJT used in this illustrative example, the internal collector-emitter junction voltage is approaching zero when the external VCE falls to about 450 mV, due to the voltage drop on the internal collector resistance 30. The internal base-collector junction is now forward biased, and a further increase in base current (known as "base overdrive") causes holes to be injected into the collector as well as the emitter, as shown in FIG. 3C. Note the change from a linear to a logarithmic IB scale at this point in FIG. 3D. In this "quasi-saturation" region the holes injected by the base cause a conductive electron-hole plasma to form in the collector which lowers the resistance of the collector region by conductivity modulation, as occurred in the N− region of the diode of FIG. 2C. Higher base currents cause more holes to be injected into the collector, resulting in a denser plasma and a proportional reduction in VCE (the middle region of FIG. 3D) until the collector resistance becomes lower than other parasitic resistances in the BJT. At least initially, the decrease in conduction power loss outweighs the increase in base drive power loss. The "hard," "deep" or "full" saturation region is now entered, with VCE an order of magnitude lower than when quasi-saturation was entered. In hard saturation, a higher base current results in little change in VCE while increasing the stored charge in the collector plasma. VCE actually increases somewhat as the base current approaches the collector current in magnitude, due to increased emitter current resistive voltage drops, as shown in the right portion of FIG. 3D. The power loss benefits of base overdrive are lost as deep saturation is approached and entered.

The stored charge must be removed from the collector before the BJT can turn-off and sustain voltage without high leakage currents. Removal of this charge entails a turn-off storage time, which results in an inherently slower turn-off than is achievable with MOSFETs which do not have such a stored charge. Excessive base overdrive thus also slows BJT turn off and increases switching losses.

The foregoing simplified review of semiconductor device operation illustrates that driving BJTs to minimize total losses is somewhat complex. First, a high base drive current pulse must be supplied at turn-on to drive a BJT into quasi-saturation as quickly as possible to minimize turn-on switching losses. Second, the "on" base drive current must be controlled to provide a near optimal degree of BJT quasi-saturation to minimize the sum of drive and conduction losses over a range of conduction currents. Third, the quasi-saturation voltage v. drive current relationship must take switching frequency into account at higher frequencies, i.e., higher quasi-saturation voltages reduce stored charge, leading to faster turn-off and lower switching transition losses. Finally, the conductivity modulating stored charge must be removed as quickly as possible through a high reverse base drive current, further minimizing turn-off losses. This latter aspect is discussed in more detail in the above-referenced U.S. patent application having Ser. No. 09/971,047 and attorney docket no. CARS0001.

It has long been known that, as a general rule, the "optimal" base drive to keep a BJT in a desired state of quasi-saturation to minimize drive and conduction power losses is to operate at a constant forced current gain βf is, defined as:

$$\beta f = IC/IB \qquad (1)$$

where βf is less than β in the linear region of operation. Based on both simple theory and empirical measurements, the inventor herein has found that the collector-emitter resistance (Rce) of high gain BJTs (for VCE less than a few 100 mV) may be closely approximated by:

$$Rce = Kr/IB + Ro \qquad (2)$$

where Kr is a constant, which depends on the BJT design and construction. Thus, the resistance Rce is the sum of a conductivity modulated term inversely proportional to the base current (Kr/IB) and a fixed resistance (Ro) which is not affected by the base drive current. The collector-emitter voltage, VCE, is the product of IC and Rce, which yields:

$$VCE = Kr(IC/IB) + (IC)(Ro) \qquad (3)$$

If the BJT is to be operated at the forced gain of equation (1), it can be calculated from equations (1) and (3) that:

$$IB = Kb(VCE - VCEOS) \qquad (4)$$

where "VCEOS" is a collector-emitter "offset" voltage given by:

$$VCEOS=(\beta f)(Kr) \quad (5)$$

and "Kb" is a constant of proportionality:

$$Kb=1/(\beta f)(Ro). \quad (6)$$

Thus, the present invention recognizes that the BJT will be driven at an essentially constant forced current gain if the base drive current is made proportional to the difference between the collector-emitter voltage and an offset voltage.

Various prior art circuits for driving a BJT are discussed below after the following definitions and notes. These prior art arrangements include those that drive a BJT used as a conventional transistor and those that drive a BJT used as a synchronous or controlled rectifier.

Definitions and Notes

In the following discussion, and for the remainder of this document, the following definitions and subsequent notes generally apply to circuits using BJTs as controlled rectifiers, unless otherwise stated or intrinsically implied.

1) A "transistor" is an active (controllable) semiconductor device with at least three electrodes, such that the signal present at one electrode controls the state of conduction between the other two electrodes.

2) The generic term Field Effect Transistor (FET) is used to include the Junction Field Effect Transistor (JFET) as well as the MOSFET, which in turn is used generically for any Insulated Gate FET (or IGFET), including the less commonly used Metal-Insulator-Semiconductor FET (MISFET) device.

3) A "positive" voltage will be that which is normally applied to the collector of a BJT relative to the emitter, or to the drain of a FET relative to the source, when the device is operating as a conventional transistor; a "negative" voltage will be one of reverse polarity.

4) The collector voltage of a BJT will be said to be "above" the emitter voltage when it is of a positive polarity (as defined above), and will be said to be "below" the emitter voltage when it is of a negative polarity, hence "above" is used generally as synonymous with "positive" and "below" is used generally as synonymous with "negative".

5) A "positive" current flow is one which occurs in normally conducting BJTs and FETs, i.e., from collector to emitter or drain to source respectively, regardless of device polarity; a "negative" or "reverse" current flow is in the opposite direction. Likewise, a "positive" base current is in a direction to turn a BJT on, or cause it to conduct current, while a "negative" or "reverse" base current is in the opposite direction, which will turn a conducting BJT off, again regardless of device polarity.

6) A BJT "anti-saturation" circuit is one which decreases the base drive current when the collector voltage falls below some low level, and prevents the BJT from entering deep saturation.

7) A "power" transistor is a relatively high current (typically greater than one ampere) BJT or FET serving as a conventional transistor or, in the present application, as a controlled rectifier.

8) The essentially symmetrical structure of a BJT allows it to be operated in an "inverted" mode, where the function of the collector and emitter are interchanged. The terms "emitter" and "collector" will be used in their functional context, wherein the magnitude of the emitter current of a conducting BJT is the sum of the base and collector currents of the same polarity, and is therefore larger in absolute value than either the base or collector current.

9) The structure of a power MOSFET is normally asymmetrical, as are some integrated circuit (IC) FETs, with the body of the FET shorted to the source terminal. Low voltage FETs used in ICs may be essentially symmetrical, with the FET body connected to the substrate or to a supply voltage. In the case of a symmetrical FET construction, the terms "source" and "drain" are used in their functional context in a circuit.

10) An NPN BJT and an N-channel FET are considered to be of the same "polarity" whether the FET is a MOSFET or a JFET.

11) A PNP BJT and a P-channel FET are considered to be of the same polarity and of opposite polarity to an NPN BJT or an N-channel FET.

12) Unless otherwise defined, diodes may consist of: a PN semiconductor junction; a metal-semiconductor junction (i.e., a Schottky diode); or a diode connected transistor, wherein the base of a BJT is connected to the collector or the gate of a MOSFET is connected to the drain, or a like device. For a given semiconductor material, the forward voltage drop of a Schottky diode is less than that of a P-N junction diode or a diode connected BJT. The forward conduction voltage drop of a diode connected MOSFET is determined by the drain current vs. gate voltage relationship, which depends significantly on design and construction, but is typically greater than that of a P-N junction diode or diode connected BJT.

13) The terms "rectifier" and "diode" are often used synonymously, although there are distinctions: a rectifier is a device that allows current to pass in only one direction, whereas a diode is (at least functionally) a two terminal device that may be used as a rectifier.

14) A "transconductance amplifier" is an amplifying device or circuit that produces an output current proportional to an input voltage or to the voltage difference between two inputs. In some cases, the proportionality constant of this amplifier may be defined by a control voltage or current on another input.

The symbols used for transconductance amplifiers herein are those of a conventional voltage input/voltage output operational amplifier with a current source symbol added to the output. A "double circle" current source symbol is used when the output current may be of either polarity, as first used in FIG. 15A, while a "single circle with enclosed directional arrow" current source symbol is used when the amplifier can only source current (as in FIG. 16A) or only sink current (FIG. 18).

Note that definitions (3), (4) and (5) above are equivalent to conventional usage when applied to NPN BJTs and N-channel FETs, but are the opposite of conventional usage when applied to PNP BJTs and P-channel FETs. This is done to achieve terms in the claims that are independent of the polarity of device used. Also note that:

1) The polarity of an entire circuit may be changed by changing the polarity of all transistors, and reversing the polarity of all diodes, voltage sources and current sources, without changing the essential behavior of the circuit. It is also recognized that FETs may often be substituted for BJTs and vice versa, particularly in a control or logic circuit, without changing the essential nature, function or behavior of the circuit. For this substitution the collector, base and emitter of a BJT are equivalent to the drain, gate and source of a FET, respectively. The principle limitation of device substitution is that devices must remain of the same type when a matching of characteristics is required.

2) BJTs are conventionally considered to be current driven devices, due to the roughly constant ratio between the base drive and collector currents over several decades of current, during which the base-emitter voltage changes by only a few hundred mV. FETs on the other hand are considered to be voltage driven devices, as the gate-source voltage controls the drain current with essentially no gate current flow under steady state conditions.

3) Base current drive for BJTs (e.g., a turn-on or turn-off drive command as discussed below) is usually shown herein as derived from a voltage source and a current determining resistor, but various well known current source circuits may be used instead.

4) The concept of an "optimal" BJT base drive current is utilized herein as that drive current which minimizes (or "optimizes") the sum of BJT conduction and base drive power losses for a given collector current. The optimal base drive current may also include the effects on switching losses, as well as BJT operating temperature. However, such "optima" are (as here) typically very "broad", or insensitive to moderate deviations from optimum conditions. For example, if the base drive current (and drive power loss) is 10% above or below the theoretical optimum, the change in conduction loss will be 10% lower or higher, respectively, and the sum of the two losses will only rise by about 0.5%, and is obviously well within the scope of "optimal" drive operation in practice. Operation at twice (or half) the theoretical optimum base drive, on the other hand, will raise the sum of drive and conduction losses about 25%, which begins to represent a significant loss in performance. The extent to which the losses are minimized is a design choice, and operation removed from a theoretical "optimum" may be necessary or unavoidable. Circumstances leading to deviations from an optimum BJT base drive include but are not limited to: fabrication and process variations in component values or properties; a requirement to use standard components and/or component values in the drive circuit; the desire or need to "standardize" a drive circuit for a range of BJT SR devices; or the need to operate over a range of frequencies in a given application, such as in a resonant converter.

Prior Art

While there are several prior art techniques for driving a BJT, not all of these are applicable to driving a BJT used as a controlled rectifier (CR). A reason for this inapplicability is that in conventional BJT implemented circuits the applied voltage does not reverse polarity, while in controlled rectification the applied collector emitter voltage does reverse direction. In addition, in controlled rectification a BJT CR must be able to be turned-off rapidly with either polarity of applied voltage; both when the applied voltage reverses (as with a conventional or synchronous rectifier) and when on-demand turnoff is desired with forward voltage applied to achieve controlled rectification. Several prior art approaches or techniques are now discussed. Note that many disclose use of a synchronous rectifier.

FIG. 4 illustrates a transformer-coupled proportional base drive technique, also known as regenerative drive. Turn-on of power BJT 40 is accomplished by turning transistor 41 on momentarily, which draws a pulse of current from voltage source 46 through current limiting resistor 45 and winding 43 of transformer 47. This current is transformed into a pulse of current in the base of BJT 40 through winding 49, turning BJT 40 on. Collector current in BJT 40 is then transformed into a proportional base drive current by the turns ratio of windings 48 and 49. Turn-off is accomplished by turning 42 on momentarily, which pulses sufficient current through winding 44 to overcome the collector current in 48, reversing the base drive current and turning BJT 40 off.

This drive method has numerous advantages, including an optimal base drive during conduction through direct "sensing" of the collector current, relatively fast turn-on and turnoff, a near minimum drive power requirement, transformer isolation between the drive circuitry and the power transistor and operation from a single drive supply voltage. A disadvantage is an inability to turn the BJT off under "fault current" conditions, when resistor 45 limits the turn-off drive to the point where the BJT 40 base drive current cannot be reversed to initiate the turn-off process. Other disadvantages relate to the requirement for a transformer which tends to be relatively large and expensive and which places limits on the maximum conduction duty cycle due to the need to reset the core magnetization current during the "off" interval. A principal disadvantage is that the drive method cannot be directly adapted to CR; any connection of base drive winding 49 to either the collector or emitter of BJT 40 would allow uncontrolled conduction of BJT 40 in one direction or the other.

FIG. 5 illustrates another adaptation of a regenerative drive current transformer to a BJT rectifier. The opposite end of the base drive winding 59 has been moved from the emitter to the collector of BJT 40 to allow automatic turn-on when the VCE of BJT 40 becomes positive, and again there is an optimal base drive current during conduction. Turn-off is also automatic because a reverse current in winding 58 reverses the base drive current in winding 59. Other advantages of the embodiment of FIG. 5 are an absolute minimum of base drive power consumption and no need for base drive voltage sources. Versions of this BJT SR drive method have been utilized in U.S. Pat. No. 3,582,758, granted to Gunn on Jun. 1, 1971, for a Rectifier using low Saturation Voltage Transistors, and U.S. Pat. No. 3,940,682, granted to Park et. al., on Feb. 24, 1976, for Rectifier Circuits using Transistors as Rectifying Elements, among others.

Disadvantages are a relatively slow turn-on and turn-off unless additional circuitry is employed, as discussed by Eiji Sakai and Koosuke Harada in "A New Synchronous Rectifier Using Bipolar Transistor Driven by Current Transformer," published in the proceedings of the IEEE INTELEC 1992 conference, pp. 424–429. The principal drawback of the circuits illustrated in FIGS. 4 and 5 is the requirement for the drive transformer itself, which is relatively large and expensive, and thus unsuitable for large volume, low cost, high power density circuits. Use of a drive transformer also places restrictions on the relative "on" and "off" periods of a driven BJT, as noted above. The drive method also has the same limitation as that of FIG. 4, requiring additional circuitry to enable blocking of current flow in either direction, as required for CR.

Various transformerless BJT drive circuits are illustrated in FIGS. 6 through 10. In the circuit of FIG. 6, switch 61 connects a base driving resistor 62 to a positive voltage source 63 for turn-on of BJT 40, while turn-off is accomplished by switching the resistor to a negative voltage source 64. A faster turn-on and turn-off is provided by surge currents through a "speed-up" capacitor 65, which may have a series resistance (not shown) to limit the surge current. Besides the requirement for a second drive voltage of opposite polarity, the principle disadvantage of this circuit is a constant base drive current regardless of collector current. This causes BJT 40 to be overdriven into deep saturation at collector currents somewhat less than the design maximum, increasing power losses through slower switching and excess drive currents. The "on" and "off" base drive currents, and thus the saturation voltages and switching times are also dependent on (and will vary with) the drive supply voltages. This can become problematic, particularly when the drive supply voltages are derived from a winding on a power converter transformer or inductor.

The need for the second drive voltage can be avoided by using the circuits of FIGS. 7 and 8. In FIG. 7, the negative voltage source 64 is simply eliminated and switch 61 now connects to the circuit "common" to turn BJT 40 off. There is still a turn-off base current pulse due to the "on" state voltage on capacitor 65, but turn-on and turn-off will be a little slower unless the size of capacitor 65 is increased to compensate for the lower voltage swing on 62 and 65. An alternative approach to speed up turn-off, which requires more drive charge (product of current and time) than for a fast turn-on, is shown in FIG. 8. Turn-on of BJT 40 is essentially similar to FIG. 6 or 7, but turn-off is accomplished by switching the drive voltage 63 to a second (smaller) BJT 69, through drive resistor 67 and speed-up capacitor 68 which "shorts out" the base of BJT 40 to the emitter. Since the turn-off base current can be very high due to the current gain of BJT 69, the turn-off can be faster than with previous approaches if the internal base impedance of BJT 40 is sufficiently low. While the drive circuit of FIG. 6 could be used for synchronous or controlled rectification as long as the negative drive voltage 64 is greater than the reverse collector voltage on BJT 40, the drive circuits of FIGS. 7 and 8 cannot be so used. This is because when the collector voltage on BJT 40 becomes negative during the intended "off" period, a positive base current will flow through resistor 62 (in FIG. 7) or BJT 69 (in FIG. 8), turning BJT 40 "on" in the inverted mode.

The problem of a constant base drive current "overdriving" the BJT at lower collector current in FIGS. 6–8 can be addressed with a Baker clamp anti-saturation circuit. An example is shown in FIG. 9, with diodes 70, 71 and 72 added to the drive circuit of FIG. 6. Diode 71 biases the anode of diode 70 a "diode drop" (about 0.7 V) higher than the base of BJT 40 during the "on" drive period. When the collector voltage of BJT 40 falls below the base voltage, diode 70 conducts to divert excess base drive current to the collector, reducing the base drive until the collector voltage ceases to fall. This keeps BJT 40 out of deep saturation, but the collector-emitter "on" voltage is now nearly constant with the collector current; the VCE could be lower at lower currents to reduce conduction loss. Diode 72 allows reversal of the BJT 40 base current for driving turn-off of that transistor.

As shown in FIG. 10, the Baker clamp performance can be improved by the addition of a resistor 73 in series with diode 70. At lower collector currents there will be more base drive current diverted through diode 70 and the increased voltage drop on resistor 73 allows the VCE of BJT 40 to fall to a lower level. Suitable selection of component values allows an essentially constant forced gain of BJT 40 to be achieved. The Baker clamp could also be applied to the drive circuits of FIGS. 7 and 8, but they would still not be suitable for synchronous rectification driving due to SR BJT turn-on with a negative collector voltage applied.

Although the modified Baker clamp circuit of FIG. 10 could be made "self driving" with additional circuitry to determine when the BJT SR should be turned "on" and "off", it would still have several severe limitations in addition to the requirement for two drive supply voltages. First, the drive current is always at the high level required for the maximum collector current, with the excess drive current simply diverted to the BJT collector at lower collector currents. Thus drive power savings at lower collector currents are not realized.

Furthermore, unlike the circuit of FIG. 5, the circuit of FIG. 10 is not self driving for CR applications. It would require additional circuitry to determine when the CR BJT is to be driven "on" and "off".

A greater problem is the insufficiently accurate control of IB vs. VCE for CR applications.

One reason for using a rectifying transistor is to achieve a lower voltage drop than obtainable with conventional P-N or Schottky diodes, which can be as low as 300 mV or less for applications below 10V DC output. Thus, BJT CR quasi-saturation voltages must be in the range of a few tens of mV to about 200 mV maximum for there to be any efficiency advantage in using BJTs as controlled rectifiers. This requires a VCE sensing and control accuracy of perhaps 5–20 mV or better over a wide range of ambient and junction temperatures (from −65° C. to +125° C. ambient in severe applications), with BJT CR junction temperatures perhaps 5–50° C. higher than ambient. This is difficult if not impossible to achieve with Baker clamp circuitry. A Baker clamp (and other BJT anti-saturation circuits) controls IB based on the collector-base voltage VCB of a BJT, rather than the collector-emitter voltage VCE, which differs from VCE by the base-emitter "diode" voltage VBE. The problem is that the forward voltage drop of diodes (including the VBE of BJTs) can vary by 50–100 mV or more from one device to another (unless part of the same integrated circuit) and the forward drop changes with temperature at a typical rate of about 2 mV/°C. Even if diodes 70 and 71 of FIG. 10 are matched and thermally coupled, problems are still encountered with variations in the VBE "diode" voltage of BJT 40, both from device-to-device and with temperature changes. Thus, the Baker clamp can control the IB vs. VCE relationship only to within about 200 mV or so, which is inadequate for low voltage SR applications. Other prior art BJT anti-saturation circuits utilize only a diode coupled between the base and collector of a BJT, without a diode in series with the base drive (such as diode 70 in FIGS. 10 and 11). These might appear to overcome the 2 mV/° C. temperature coefficient (TC) problem, with the TC of the anti-saturation diode compensating for that of the VBE of the BJT, but this is not the case. The junction temperature of the BJT, which is dissipating significant power, will not match that of the anti-saturation diode. Even a modest 25° C. junction temperature difference will result in about a 50 mV error in the VCE quasi-saturation voltage, which is unacceptable for low voltage SR applications.

Other prior art circuits have also been developed to provide some form of "self driving" for a BJT used as a SR or CR. These circuits are now discussed.

FIG. 11 is a reproduction of FIG. 1 of U.S. Pat. No. 4,716,514, issued to Patel on Dec. 29, 1987, for a Synchronous Power Rectifier. When primary side transistors Q1 and Q2 are on and SR Q3 is to conduct, it is turned on by the voltage on the N2 winding of transformer T1 producing a current flow in R1. When Q1 and Q2 turn-off, the voltage on N2 reverses and turns Q3 off (in a manner similar to FIG. 6, without the speedup capacitor), while Q4 is turned on by the voltage on the N2 winding of inductor L1 causing a current to flow in resistor R2. A problem arises when Q1 and Q2 turn back on as the voltage on N2 of L1 tries to keep Q4 on when it must be turned off. This problem is solved by the addition of winding N4 to transformer T1 which forces Q4 to turn-off by reversing the base current flow of Q4 through diode D3.

Advantages of this circuit are that no drive voltage supplies are required for turn-on or turn-off, and no additional magnetic devices are required. Disadvantages of this circuit, on the other hand, are several. Extra windings are generally required on the existing magnetics and the turn-off drive delivery may be delayed which results in higher losses than with a timely delivered turn-off drive command. Perhaps more significant, are the problems previously discussed in regard to the prior art circuit of FIG. 6. First, the available drive currents vary with changes in operating voltages. A severe example occurs when the output (Vo) is overloaded and the voltage falls to near zero, providing no drive voltage to turn-on Q4 (when Q3 is off) until the voltage on Q4 becomes relatively high, causing large conduction losses. Second, the rectifier base drive currents are "fixed" and do not change with collector current, driving the rectifiers into deep saturation at lower current levels, slowing switching and increasing power losses. This circuit as taught lacks the switching speed-up capacitors and Baker clamp circuits discussed previously, though these could be added by a skilled practitioner. Nonetheless, the problem of a lack of precise control of quasi-saturation voltages would remain. This self-driving SR circuit also does not readily lend itself to controlled rectification.

FIGS. 12A and 12B are reproductions of FIGS. 5 and 6 from a paper by W. E. Rippel entitled "A New Closed Loop Adaptive Base Drive Scheme Minimizes Transistor Drive and Saturation Losses," published in the proceedings of Powercon 11 (Section G1, pp. 1–13), April 1984, Dallas, Tex. The designators "U" and "Q" have been added to the operational amplifier (op-amp) and BJT of FIG. 12A, respectively. This paper provides a tutorial on prior art BJT driving techniques and is hereby incorporated herein by reference.

When the switch SW-1 of FIG. 12A is in the ON position, the op-amp U generates a voltage across resistor RS (and thus a base drive current IB) which is proportional to the difference between voltages V'CE and V1. Since the voltage V'CE is the sum of the voltage drop on diode D and the collector-emitter voltage (VCE) of BJT Q, this circuit can, over a range of VCE, produce a base drive current proportional to the difference between VCE and an offset voltage as required by equation (4) and as shown qualitatively in FIG. 12B for the curve labeled "ON-STATE." Note that equation (4) herein is equivalent to equation (8) in the Rippel paper, although derived by a different procedure. When switch SW-1 is in the OFF position, IB is depressed to the point where it is always negative regardless of VCE, as shown in the FIG. 12B curve labeled "OFF-STATE", and BJT Q is turned off.

This circuit achieves proportional base drive without the use of drive transformers, has high base overdrive capability for fast turn-on and turn-off, and has fewer sources of error in controlling IB vs. VCE than that of FIG. 10. Nonetheless, temperature and device-to-device variations in the forward voltage drop of diode D would still produce errors in VCE control that are perhaps ten times those that are tolerable in CR applications. It should be noted, however, that the control accuracy is quite acceptable in its intended application, which (in the paper) is the driving of 450V Darlington BJTs. The stated VCE "saturation" voltage of this high voltage BJT is given as 2.0 V maximum under rated conditions. Although not explicitly noted, quasi-saturation voltages seem to be in the range of 1.3V at lower currents to possibly 4V at maximum current, based on the marginally readable oscilloscope photographs of FIGS. 11–16 in the paper.

Although the circuit of FIG. 12A was not designed to drive a BJT as a SR or CR, it could perform the CR function. If SW1 were left in the ON position, the BJT Q would be turned off whenever the current IC tried to reverse, performing as an SR (within the base drive voltage limits of amplifier U). Placing SW1 in the OFF position turns Q off, allowing controlled rectification in principle. The IB vs. VCE control accuracy is inadequate for low voltage SR or CR applications, however, due to the uncompensated voltage drop on diode D, which is added to VCE of Q to produce the voltage V'CE actually sensed by amplifier U.

The circuit of FIG. 13A is reproduced from FIG. 7 of a paper by the inventor herein entitled "Isolation of Faulted Power Modules in Low Voltage DC Distributed/Redundant Power Systems" published in the proceedings of the PCIM'91 conference, pp. 52–64, September 1991, in Universal City, Calif. (resistor designators have been added). This paper proposed the use of a BJT as a reverse current "blocking diode" in the output of paralleled low voltage power supplies. The BJT drive circuit of FIG. 13 senses the VCE of Q1 with BJTs Q2 and Q3 coupled to the collector and emitter of Q1, respectively. Feedback through Q5 keeps the currents in matched BJTs Q2 and Q3 equal when Q1 is conducting so that the voltage on resistor R1 is equal to the VCE of Q1, and thus the current in R1 is accurately proportional to VCE. When the VCE of Q1 rises to about 30 mV, the 200 uA current in R1 (and R3) produces a sufficient voltage across R3 to begin turning Q4 on. The base drive current to Q1 from Q4 is then proportional to the increase in the Q1 VCE voltage, satisfying the relationship of equation (4) with a forced gain βf of 167. The base current IB of Q1 is plotted as a function of VCE in FIG. 13B.

An advantage of this circuit is that the accuracy of VCE sensing is many times better than that of the other prior art discussed. In addition, turn-on is automatic and reasonably fast, requiring a momentary high positive VCE on Q1 to generate the turn-on base drive current pulse. No provision was made for turning Q1 off, however, and any VCE below 30 mV simply causes base drive to Q1 to cease. The Q1 self turn-off time is on the order of one to several microseconds which is very slow by fast rectifier standards, but would be adequate for the intended isolation of a faulted power module, particularly compared to the alternative use of fuses with "blowing times" on the order of milliseconds. Adapting this BJT drive method, with its accurate sensing of VCE and control of BJT base current, to perform CR at high frequencies is an object of the present invention.

Another technique for controlling the drive current of a BJT SR to avoid deep saturation is taught in two related U.S. Pat. Nos. 5,721,483 and 5,905,368 granted to Kolluri et. al. on Feb. 24, 1998, and May 18, 1999, respectively, both for a Method and Apparatus for Enabling a Step-up or Step-down Operation Using a Synchronous Rectifier Circuit. FIG. 5 from both of these patents is reproduced as FIG. 14 herein. FIG. 14 illustrates a synchronous rectifying BJT Q1 of the PNP type (as opposed to the NPN type used for illustration of the present invention further below).

Kolluri et al. states in the '368 patent that "In the preferred embodiment, the base drive to the PNP [pass] transistor is controlled such that the collector current is about 0.9 times the collector current value if the device were operating with VCB of 0 V . . . " for which ". . . the VCE across the device is approximately 200 mV." (Col. 6, lines 32–39.)

In essence, this is accomplished by using Q2 as a "replica" device which is "scaled 1/N of PNP pass transistor Q1" (Col. 6, line 50). Transistors Q6 and Q5 force Q3 to operate with a VCB of approximately zero volts, but transistor Q2 (matched to Q3) is made to conduct about 90% of the Q3 collector current by the 1:0.9 scaled current mirror consisting of Q11 and Q12 with emitter resistors R3 and R4, respectively. Since Q2 and Q3 have the same VBE, Q2 conducts only 90% of the collector current that would flow if VCB were zero, and is thus on "the edge of saturation." Furthermore, the control circuit also maintains a close relationship between the VCE of replica device Q2 and that of PNP pass transistor Q1, through the action of transistors Q7, Q8 and associated circuitry (Col. 6, lines 54–56). Since Q1 and Q2 also have the same VBE, Q1 likewise operates on "the edge of saturation" with a forced gain about 10% lower than the IC/IB ratio at VCB=0.

The principal drawback of this approach is that the drive control circuit requires transistors which are accurate "scale models" of the SR transistor, and is thus only suitable for applications where the SR transistor and drive control are integrated on the same semiconductor chip. Another limitation of the circuit is the apparent use of resistor R1 to turn Q1 off, a common technique for conventional transistors. Schottky diode D3 in series with R1 would prevent turn-on of Q1 in the inverted mode when VCE reverses, but under those conditions R1 would not provide turn-off drive in the form of a reverse base drive current, and turn-off would be relatively slow.

In view of this and related prior art, a need exists for a low cost BJT controlled rectifier drive circuit and method that achieves:

Automatic turn-on of the BJT CR when current flow would be in a forward direction, and turn-off of the BJT when current flow would be in a reverse direction;

Fast turn-on of a BJT CR through a high initial base drive current;

Fast turn-off of a BJT CR through a high reverse base drive current when the collector-emitter voltage is near zero or negative;

On demand turn-off of a BJT CR regardless of conduction state across the BJT.

Base drive proportional to VCE (above an offset voltage) during the "on" conduction period without the need for current transformers;

Precise control of the BJT quasi-saturation voltage during the "on" period, without VCE sensing errors due to mismatched diode drops, uncompensated diode drop TCs, or TC [what is TC?] errors due to differing junction temperatures; and Operation over a range of drive supply voltages without significant change in current control and drive characteristics.

It is further desirable for reduced cost that the circuit and method be capable of operation with a single drive supply voltage and be suitable for realization as an integrated circuit, with or without the power BJT CR integrated on the same semiconductor chip.

The last requirement mandates that the drive circuit consist almost exclusively of diodes, transistors and resistors, with capacitor requirements limited to small value integratable capacitors or external "supply voltage bypass" capacitors or the like. The use of transformers or inductors would also not meet these requirements.

SUMMARY OF THE INVENTION

Accordingly, it is an object of the present invention to provide a BJT CR drive circuit that achieves controlled rectification in an energy-efficient and a cost-efficient manner.

It is another object of the present invention to provide such a drive circuit that achieves rapid turn-on and turn-off of a BJT used as a controlled rectifier.

It is another object of the present invention to provide a BJT CR drive circuit that operates over a wide range of drive supply voltages.

It is also an object of the present invention to provide a BJT CR that overcomes the shortcomings of the prior art and achieves the desired features set forth above.

These and related objects of the present invention are achieved by use of an apparatus and method for control and driving BJT used as controlled rectifier as described herein.

The attainment of the foregoing and related advantages and features of the invention should be more readily apparent to those skilled in the art, after review of the following more detailed description of the invention taken together with the drawings.

BRIEF DESCRIPTION OF THE DRAWINGS

FIGS. 1A–2C illustrate the basic construction and rectification behavior of P-N junction diodes.

FIG. 4 illustrates a schematic diagram of a prior art circuit that uses a current transformer to drive a BJT with a proportional base drive current.

FIG. 5 illustrates a schematic diagram of a prior art circuit that uses a current transformer to drive a BJT rectifier.

FIG. 6 illustrates a schematic diagram of a prior art circuit for driving a BJT with a positive or negative voltage source.

FIGS. 7–8 illustrate schematic diagrams of prior art circuits for driving a BJT from a single voltage source.

FIGS. 9–10 illustrate schematic diagrams of prior art circuits that use a Baker clamp to prevent saturation of a BJT.

FIGS. 12A–12B illustrate a schematic diagram of a prior art method for driving a BJT with a proportional base drive without a current transformer.

FIGS. 13A–13B illustrate a schematic diagram of a prior art method of driving a BJT as a blocking diode.

FIG. 14 illustrates a schematic diagram of a prior art integrated circuit for driving a BJT SR.

It should be recognized that various figures use the same designators when the similarly designated components serve the same function (with the exception of FIGS. 11–14 which are reproduction from prior art documents).

DETAILED DESCRIPTION

Figure 15A:
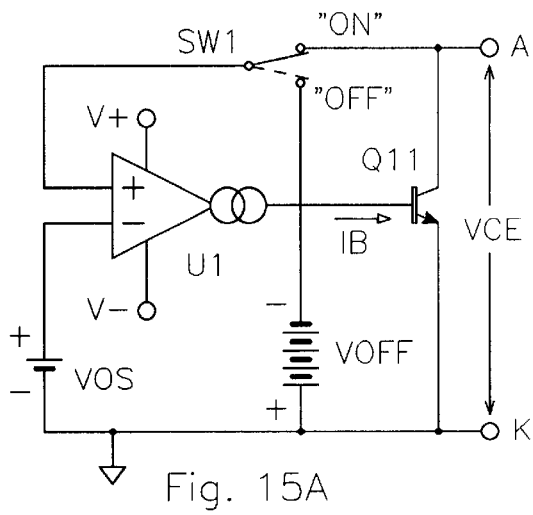
FIGS. 15A–15D illustrate diagrams of a circuit for driving a BJT CR with proportional base drive in accordance with the present invention.
Figure 15B:
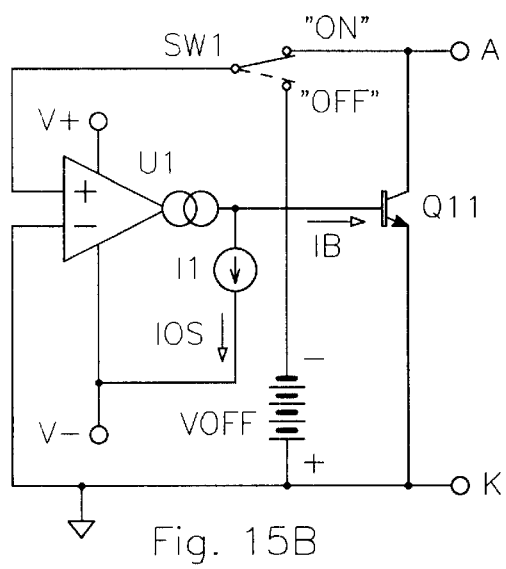
Figure 15C:
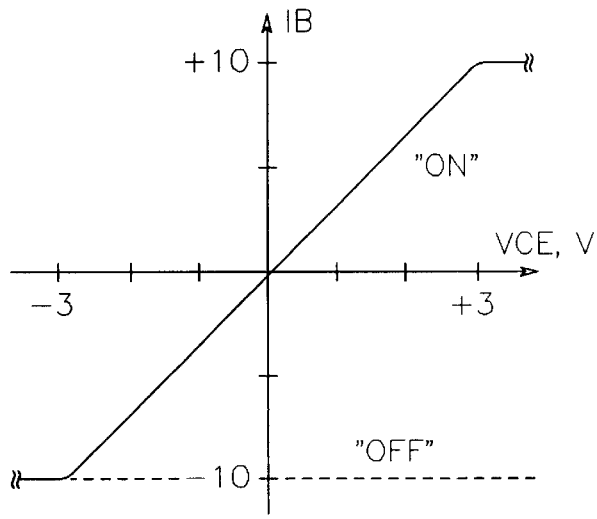
Figure 15D:
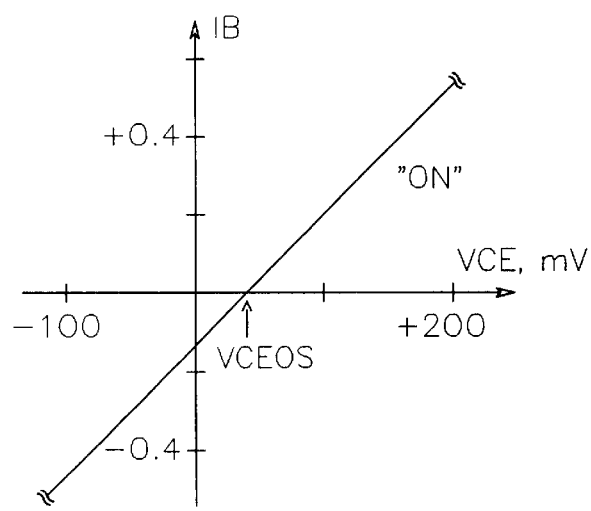

As noted previously, CR are controlled to exhibit either of two modes of operation; these may be a "normal" mode where behavior is that of a SR, and a "forced" or "driven" off mode which blocks current flow in the forward as well as the reverse direction. In FIGS. 15A–18 a switch SW1 is used to establish the operating mode; SR behavior occurs when SW1 is in the "ON" position and "forced-off" mode behavior (where current flow is blocked in either direction) occurs when SW1 is in the "OFF" position. For each circuit, SR operation is described first with SW1 "ON", followed by the "forced-off" mode with SW1 "OFF". An alternative would be to design the CR to be normally off, and control the rectifier to conduct when desired. Referring to FIGS. 15A–B, two exemplary schematic diagrams of a circuit for driving a BJT CR in accordance with the present invention are shown. FIGS. 15C–15D illustrate plots that correspond to the embodiments of FIGS. 15A–15B.

FIG. 15A illustrates a transconductance amplifier U1 (defined above) that has inputs which are directly coupled through "ON" switch SW1 across the collector and emitter of a CR BJT Q11. The output of transconductance amplifier U1 is coupled to the base of Q11. It should be recognized that the transconductance amplifier designation represents the function of transconductance amplification and the actual implementation, as illustrated elsewhere herein, is carried out with various component devices. The varied component arrangements are preferably, but not necessarily, fabricated on a semiconductor substrate.

Figures 1A, 1B, 1C:
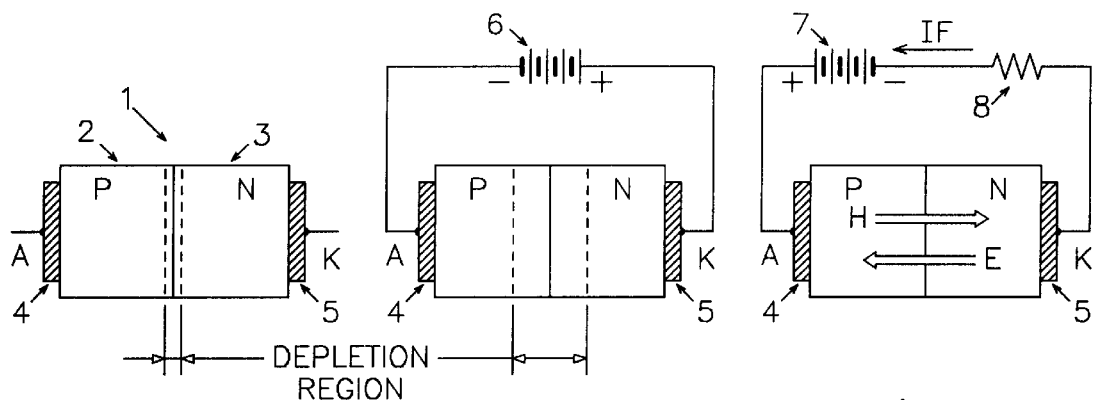
Figures 2A, 2B, 2C:
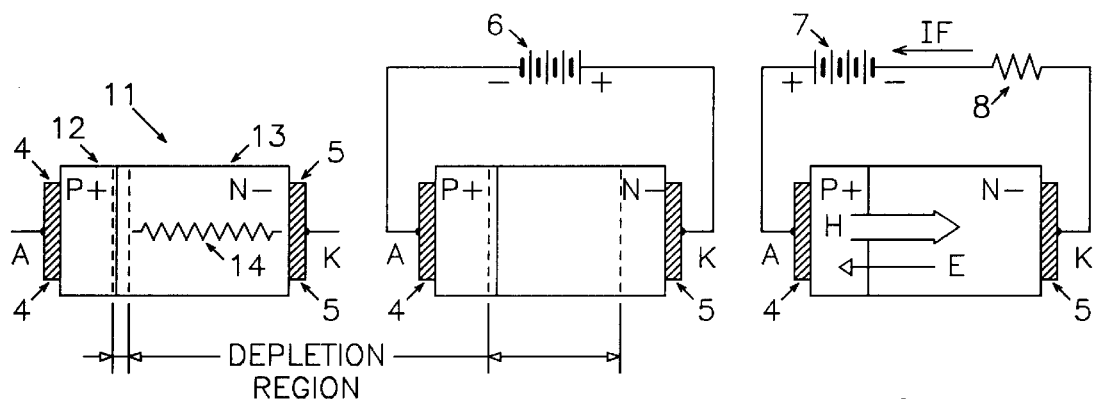
Figure 3A:
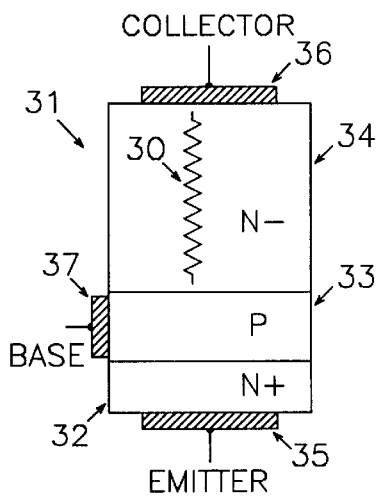
FIGS. 3A–3D illustrate the basic construction and control properties of a BJT.
Figure 3B:
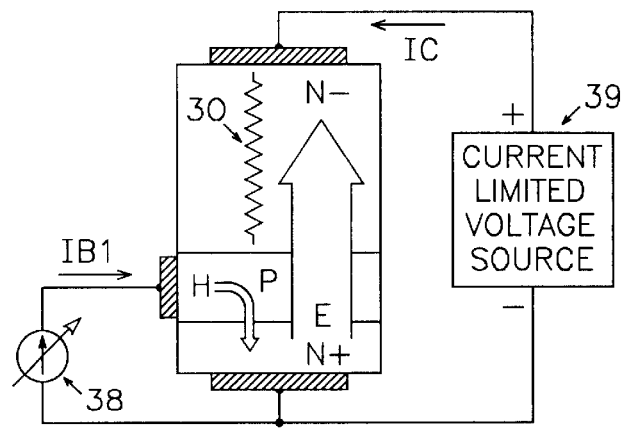
Figure 3C:
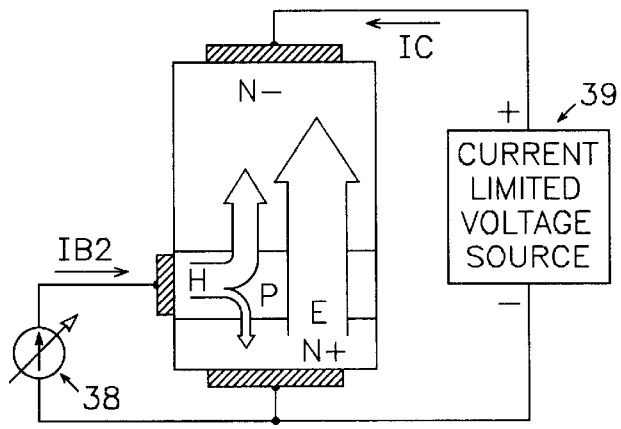
Figure 3D:
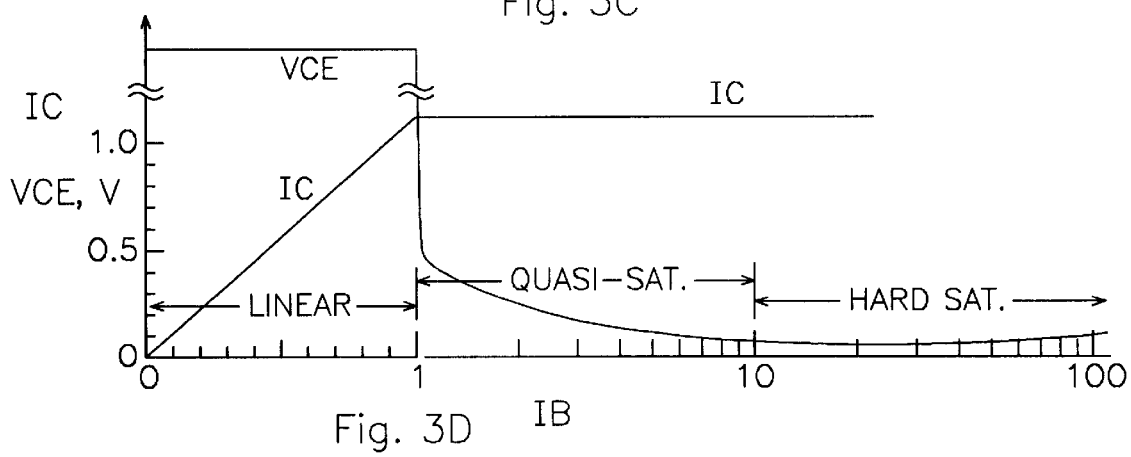
Figure 10:
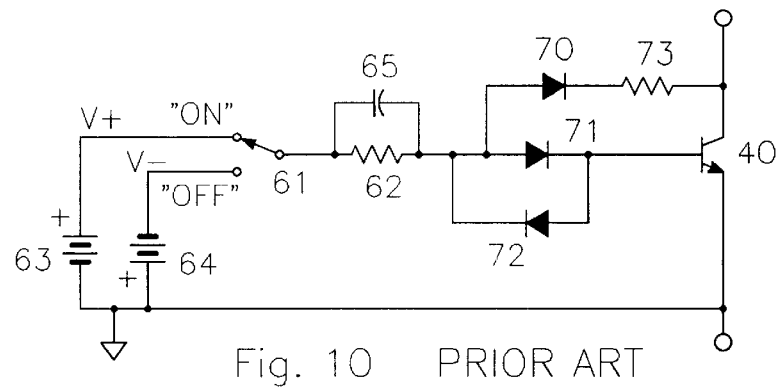
Figure 11:
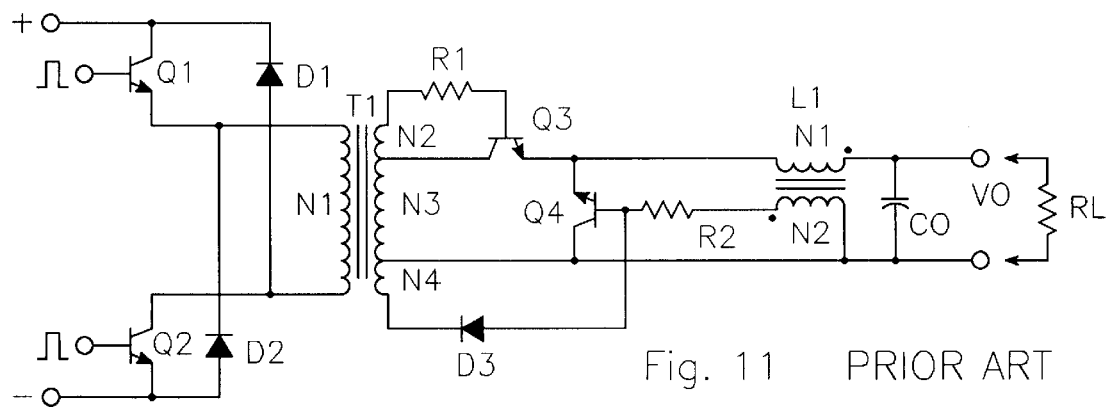
FIG. 11 illustrates a schematic diagram of a prior art method of driving a BJT SR from windings on power converter magnetics.
Figure 12B:
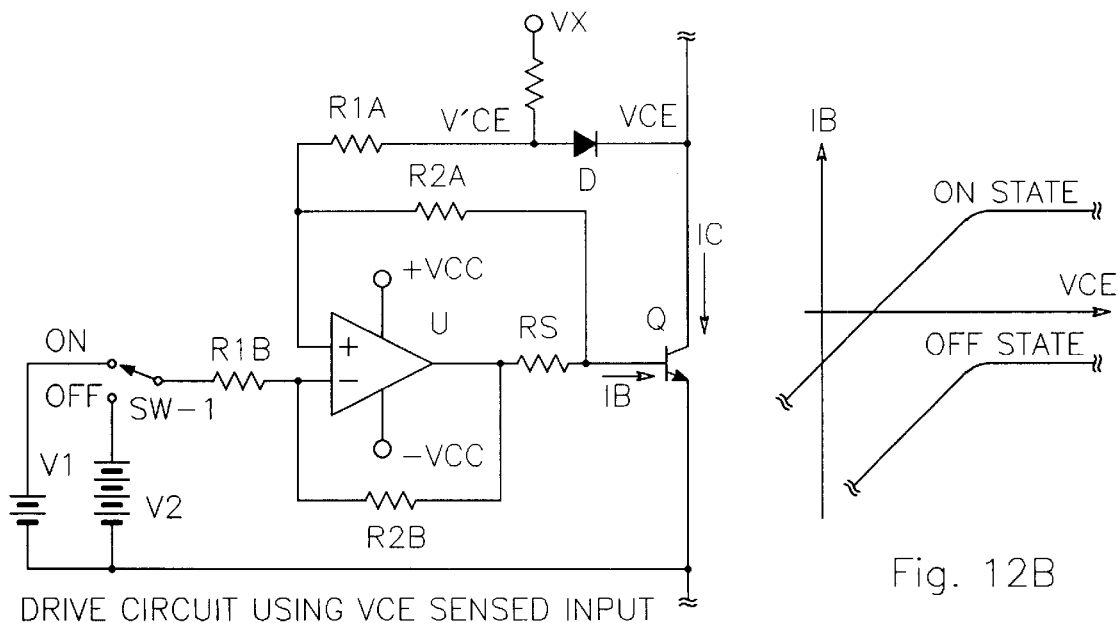

The connection of the transconductance amplifier inputs to Q11 is made without the use of a series diode and its accompanying voltage drop (such as diode D in the prior art of FIG. 12A). The connection is further made with no other sources of significant voltage sensing error, for example, there are no unmatched or uncompensated diodes, transistors or similar semiconductor or PN junction voltage drops. The elimination or compensation of these voltage drops and the like removes temperature sensitivity from the sensing pathway. Accordingly, U1 accurately senses the collector-emitter voltage VCE of CR BJT Q11 and provides a base drive current IB essentially proportional (see VCE v. IB graphs herein) to the voltage difference between the positive (+) and negative (−) inputs of amplifier U1. Furthermore, the VCE at which IB=0 is "offset" from VCE=0 is preferably a small positive "offset" voltage VCEOS, typically on the order of 5 mV to 50 mV (see FIG. 15D). Under current state of the art practices, VCEOS may be closer to the 30–40 mV range, but may decrease in the future, or be otherwise different while still providing the IB v. VCE relationship(s) discussed herein. This VCEOS is the same as the VCEOS provided in equation 4. The VCEOS effectively provides an imbalance in the sensing pathway as indicated by Eq'n 4 above.

In the embodiment of FIG. 15A, the offset voltage is realized by placing a positive offset voltage source VOS in series with the negative input of U1. The base drive current IB is now zero when VCE=VOS. VOS in this instance is thus VCEOS. The same result could be achieved by placing a negative offset voltage in series with the positive input of U1 (not shown).

Referring to FIG. 15B, an equivalent manner of achieving VCEOS can be realized by coupling an offset current source "IOS" to the output of amplifier U1, rather than coupling an offset voltage source to the input. The magnitude of IOS is chosen to equal the U1 output drive current ID (and thus cause the Q11 base current IB to be zero) when the VCE of Q11 is equal to the desired offset voltage VCEOS. As alluded to above, the equivalent of an input offset voltage VCEOS can be accomplished by an intentional small fixed imbalance anywhere in the transconductance amplifier, VCE sensing or base drive circuit, including integrated circuit transistor "size" differences to produce a well defined difference in conduction characteristics (generally consistent with the dictates of Eq'n 4).

The global or overall control and driving function of U1 is plotted in FIG. 15C. The horizontal axis is the VCE of CR BJT Q11 in volts at a representative scale that might be typical in low voltage rectification applications, though the present invention may be practiced at other voltage levels. The vertical axis is Q11 base current as generated by U1 which is shown in arbitrary units (i.e., a unit of current) because the value in practical applications may range from a few milliamps or less to several amps or more. It can be seen that IB is essentially proportional to VCE over a wide range of collector-emitter voltages (the effect of VCEOS at this scale is not readily discernable).

Above some value of VCE the drive output of amplifier U1 will typically "limit" or "flatten off" in many circuits, where a CR may typically be utilized. This is shown to occur at about ±3V in the illustrated plot though the "limit" voltage may differ in other implementations. This limiting of base drive current may or may not occur within the normal operating VCE range in any given application. The base drive current limiting, however, should occur if at all well above the maximum normal VCE conduction voltage (typically 50–200 mV) such that a Q11 base overdrive current is generated when a positive collector-emitter voltage is first applied to Q11, which accelerates the Q11 turn-on process.

FIG. 15D plots an IB vs. VCE relationship (in accordance with the present invention) near the origin of the FIG. 15C plot. The effects of offset voltage VCEOS can be observed in FIG. 15D. The base drive IB becomes negative and turns off CR BJT Q11 when there is still a small positive voltage VCE on Q11. The VCE of Q11 during normal conduction will thus always be greater than VCEOS. As discussed in the Background of the Invention section and shown in equation (4), this small VCEOS (or small "imbalance") in the CR BJT conduction voltage is required to realize an ideal IB vs. VCE relationship over a broad range of BJT collector currents.

In operation, the CR BJT Q11 is initially "off" when a forward voltage is first applied, but the relatively high VCE causes a high forward IB to flow, which provides a high base drive turn-on pulse until VCE falls to the operating level, i.e., a steady-state condition. This momentary forward voltage is analogous to the "forward recovery" voltage for a P-N junction diode.

During conduction, the proportionality between IB and VCE (with VCEOS) provides the optimal base drive current for a given conduction current, as required by equation (4) above.

The turn-off of BJT Q11 is initiated by a reverse base current IB when the VCE falls below VCEOS or reverses. Note that the reverse or negative base drive current shown in these and subsequent figures is that which is available to turn the CR BJT off when VCE is reverse biased, and flows only during the turn-off transition. Once the CR BJT is off, reverse base current preferably falls to essentially zero.

In addition to operation in synchronous rectification mode with SW1 "ON" (in the embodiments of FIGS. 15A–15B), in the "OFF" position SW1 functions to connect the inputs of U1 to a VOFF voltage supply to turn Q11 off regardless of the polarity of VCE. VOFF is preferably near to (or greater than) the IB "limit" voltage (about −3V in FIG. 15C) to result in a maximum negative base current for fast turn off of Q11, as shown by the phantom "OFF" line of FIG. 15C. Since the "limit" voltages must be less that the U1 supply voltages, VOFF could be the V-supply for U1.

Switching the U1 inputs to VOFF is only one of many possible control means. Overriding the normal transconductance behavior of U1 at any point between the inputs and the base drive output to Q11 can be used to achieve the same result of forcing Q11 off regardless of the polarity of VCE. Several of these alternatives will be explored in the circuits of FIGS. 19–22A.

A drawback of the embodiment of FIG. 15, however, is that while a high reverse VCE generates a high reverse IB and the turn-off of conduction current may be reasonably fast, a low reverse VCE (and IB) results in slower Q11 turn-off. Another disadvantage of the embodiment of FIG. 15A is that it requires two drive supply voltages of opposite polarities as shown by the "V+" and "V−" inputs to amplifier U1.

Figure 16A:
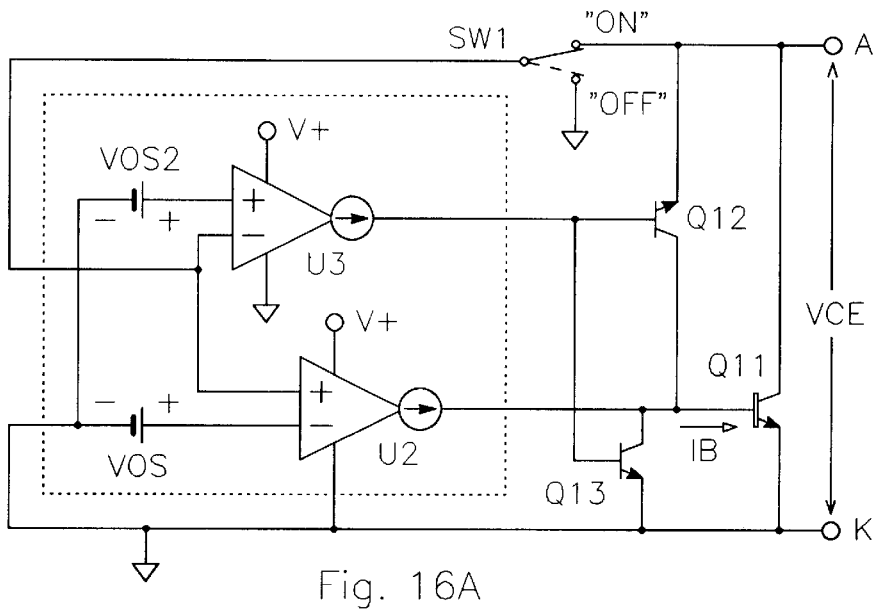
FIGS. 16A–16C illustrate diagrams of an another circuit for driving a BJT CR with enhanced turn-off drive in accordance with the present invention.
Figure 18:
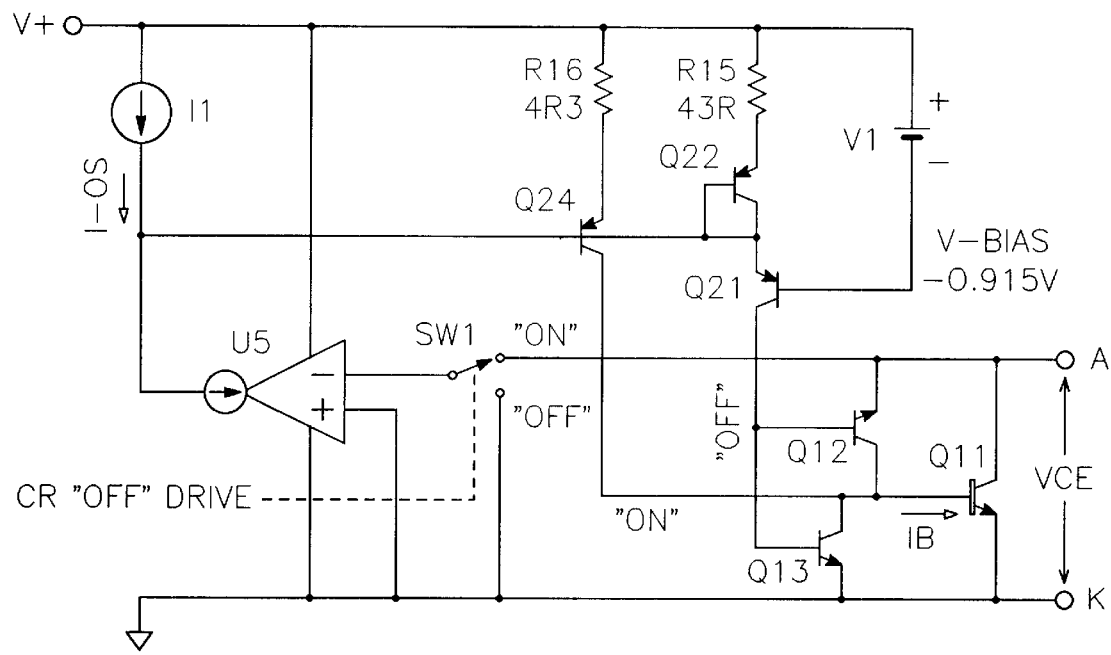
FIGS. 18–21 illustrate circuit diagrams of several alternatives for turning a CR off.

These and other limitations are addressed in the embodiment of FIG. 16A, wherein a single drive supply may be used and turn-off of Q11 is accelerated and achieved almost equally as fast for any reverse collector voltage on Q11. The principle of this embodiment is illustrated by the conceptual circuit shown within the phantom line block in FIG. 16A. Transconductance amplifiers U2 and U3 are configured in this embodiment to only "source" (provide a positive) output current as indicated by the symbol of an outward pointing arrow within a circle that is added to their outputs. A transconductance amplifier which can only "sink" (provide a negative current) is indicated by the symbol of an oppositely directing arrow within a circle added to an output as shown in FIG. 18.

Initially SW1 is assumed to be in the "ON" position and thereby forming part of the VCE sensing pathway for accurate sensing of the VCE of Q11. Amplifier U2 (coupled to input offset voltage VOS) functions identically as U1 in FIG. 15A when VCE≧VCEOS, but provides no output current to drive the base of the BJT CR when VCE<VCEOS. The inputs of amplifier U3 are also coupled to the VCE of Q11, but with reverse polarity and with a second offset voltage VOS2 coupled to one input. When VCE is below a first threshold voltage, VTH1 (which equals VOS2), illustrated in FIGS. 16B–C (with VTH1<VCEOS, if only by a small amount), amplifier U3 now provides a base drive current to turn-on a first turn-off transistor or related device Q12 (implemented as a BJT in FIG. 16A) and a second turn-off transistor Q13 (also implemented as a BJT in FIG. 16A). Q12 is preferably coupled between the base and collector of Q11 and Q13 is preferably coupled between the base and emitter of Q11. Since the collector voltage of Q11 is nearly equal to or below (more negative than) the emitter voltage, Q12 provides a low impedance path between the base and collector of Q11, drawing a high reverse base current from Q11 to quickly discharge stored charge at the collector-base junction and quickly turn Q11 off. Amplifier U3 is preferably designed to have a higher transconductance (relative to U2, though this is not necessary) which is further enhanced by the current gain of Q12.

Figure 16B:
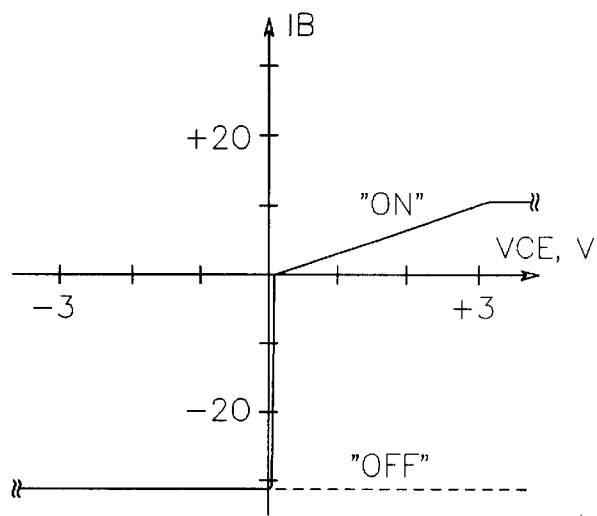

As a result, a high Q11 turn-off base drive is realized when VCE is still at a low negative value or even slightly positive as shown in the IB v. VCE plots of FIGS. 16B and 16C (which show an IB v. VCE relationship in accordance with the present invention). It should be noted that the maximum reverse IB current is limited by the base resistance of Q11 and the conduction impedance of Q12. FIG. 16B shows (with a change in vertical scale from FIG. 15C) that the base drive current to Q11 remains the same with VCE above VCEOS, but that below VTH1 the reverse IB increases much faster and may reach a higher value than in the circuit of FIG. 15, providing a faster turn-off with any Q11 reverse collector-emitter voltage.

With respect to the second turn-off transistor Q13, this transistor functions with Q12 and the drive currents from U2 and U3 generally as follows. The turn-off drive current to Q12, Q13 is preferably smaller than the turn-on drive current to BJT CR Q11. When the BJT Q11 collector voltage is still above its emitter voltage, the base-emitter voltage of BJT Q13 will be greater (more positive) than that of BJT Q12, and the drive current will flow preferentially through the base-emitter junction of BJT Q13. Due to the high current gain obtainable with low voltage BJTs, the reverse (turn-off) base current drawn from BJT Q11 may be several hundred times the drive current supplied to Q12, Q13, which can remove the stored charge from BJT Q11 very quickly and provide a fast turn-off.

If at any time during, or prior to, the turn-off IB going to zero, collector voltage of BJT 1 goes below the emitter voltage, then the base-emitter voltage of BJT Q12 will be greater than that of BJT Q13. The turn-off drive from U3 will now flow through BJT Q12, turning BJT Q12 on instead of BJT Q13. Stored charge in CR BJT Q11 is now removed by BJT Q12 to the collector of BJT Q11, which again turns off quickly, and the reversed collector voltage is sustained by the reverse biased base-emitter junction of CR BJT Q11. Once CR BJT Q11 is "off" and the collector voltage is below the emitter voltage, there is still a small minimum apparent "leakage" current which is the turn-off base drive to BJT Q12 flowing out of the BJT Q12 emitter.

An advantage of the circuit of FIG. 16A is that the turn-off drive is automatically routed to the appropriate turn-off transistor.

Figure 16C:
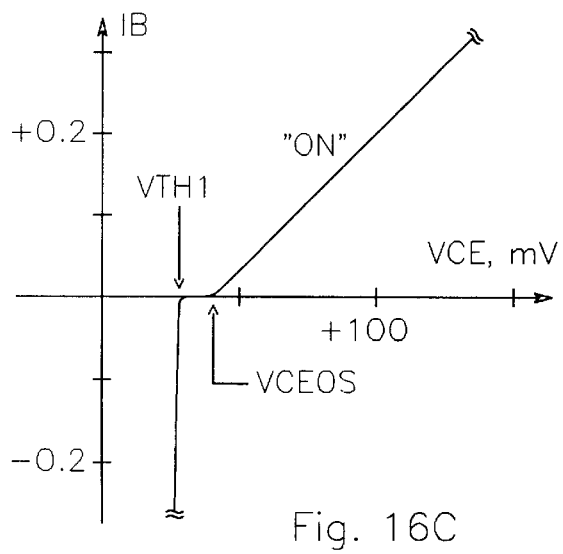

A small scale view of IB vs. VCE near the origin of FIG. 16B is provided by FIG. 16C. FIG. 16C illustrates that VTH1 is typically a small positive voltage, but less than VCEOS. If VTH1>VCEOS, on-off oscillations are likely to occur at low collector currents. A small "dead band" between VTH1 and VCEOS, where essentially no base drive current is provided to either Q11 or Q12 (or Q13), is preferably provided to avoid this potential problem. Again, VOS and VOS2 need not be the discrete voltage sources shown within the conceptual circuit of FIG. 16A, but may be implemented as intentional small imbalances anywhere in the transconductance amplifier, VCE sensing or base drive circuits, or as otherwise known in the art, including integrated circuit transistor "size" differences to produce a well defined difference in conduction characteristics. One alternative implementation is illustrated in the circuits of FIGS. 8–22A below. It should also be noted that U2 could be allowed to conduct a reveres IB, in addition to the base turn-off provided by U3 and Q12, Q13.

When SW1 is placed in the "OFF" position while VCE>VCEOS, the input voltage to U2 and U3 is no longer VCE but zero (or another reference voltage below VTH1), which provides a high or maximum turn off base drive to CR Q11, as shown by the phantom "OFF" line in FIG. 16B. Under these conditions of VCE>VCEOS, the turn-off drive from U3 will flow through BJT Q13, which turns off Q11 by removing the internal stored charge from the base to the emitter of Q11. If the polarity of Q11 VCE reverses during the turn-off process, turn-off BJT Q13 will turn off and Q12 will turn on, completing the turn-off by discharging the remaining Q11 stored charge to the collector of Q11.

There are numerous ways to accomplish the equivalent function of the drive circuit in FIG. 16A, not all of which require physically separable or readily identifiable transconductance amplifiers as will be seen in a subsequent embodiments. Furthermore, the turn-off transistors Q12,Q13 in this and other embodiments need not be BJTs of the same polarity as the SR BJT Q11 or as each other, but may be a BJT of opposite polarity, or a MOSFET or junction field effect transistor (JFET) of either polarity, or other suitable active electronic device. The configuration and operation of turn-off transistors Q12,Q13 is the subject matter of an above-referenced co-pending patent application having Ser. No. 09/971,048 and attorney docket no. CARS0002.

Figure 17A:
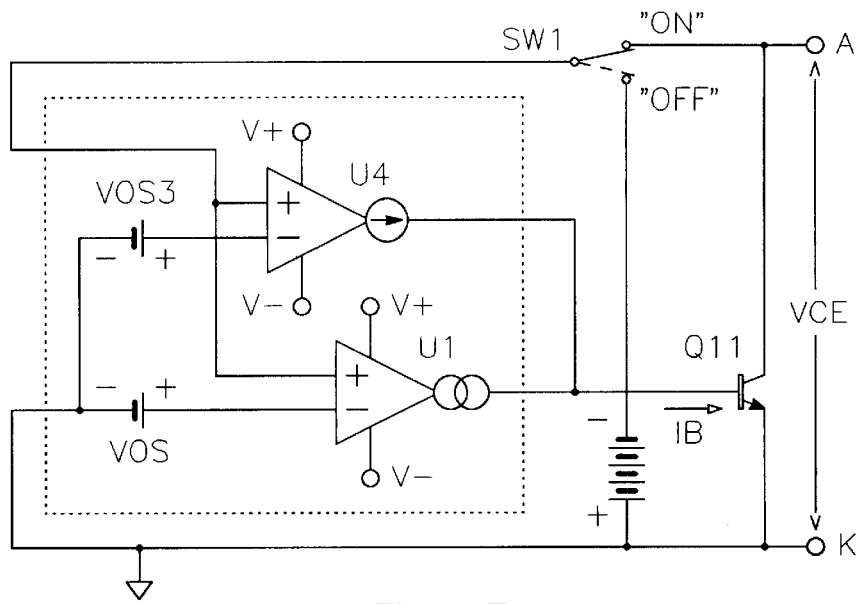
FIGS. 17A–17C illustrate diagrams of an another circuit for driving a BJT CR with enhanced turn-on drive in accordance with the present invention.

FIG. 17A illustrates a BJT CR driving circuit in accordance with the present invention in which the turn-on speed of a CR BJT can be improved over that of the preceding embodiments. This principle is illustrated conceptually with the circuit shown within the phantom line block where transconductance amplifier U1 and the input offset voltage VOS both function as discussed with reference to FIG. 15A. A second threshold, VTH2, is preferably provided (by VOS3 coupled to the negative input of U4) in the embodiment of FIG. 17A; when the VCE of Q11 is above VTH2 (=VOS3), transconductance amplifier U4 provides additional base drive current (in addition to U1) to turn Q11 on faster. VTH2 is preferably placed just above the VCE occurring during conduction of the maximum collector current, but may be located elsewhere if desired, for example, to compensate for a reduction in Q11 current gain β at high collector currents.

Figure 17B:
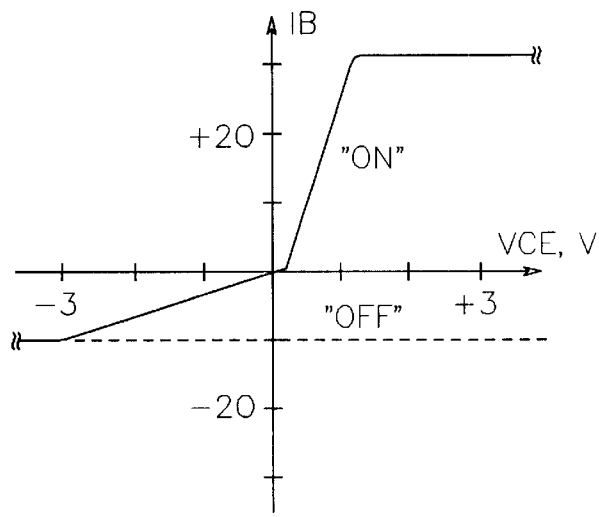
Figure 17C:
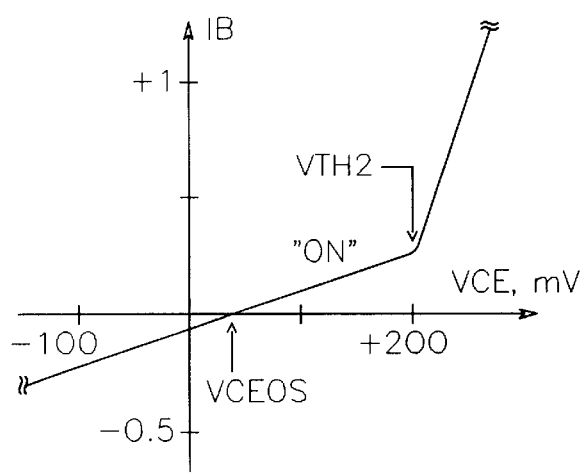

FIGS. 17B and 17C illustrate an IB v. VCE relationship of the embodiment of FIG. 17A in accordance with the present invention. FIG. 17B shows (with a relative change in vertical axis magnitude from FIG. 15C) that the base drive to Q11 remains the same with VCE below VTH2, but with VCE above VTH2, the Q11 base current IB increases significantly faster and may be designed to reach a higher drive current level before limiting, providing a faster Q11 turn-on. An expanded view of IB vs. VCE near the origin is shown in FIG. 17C where the behavior near VTH2 is more clearly seen.

There are also numerous ways to accomplish the equivalent function of the drive circuit in FIG. 17A, not all of which incorporate physically separable, discrete or readily identifiable transconductance amplifiers, as will be seen in subsequent embodiments.

As before, VOS and VOS3 need not be the discrete voltage sources shown within the conceptual circuit, but may be implemented as intentional small fixed imbalances anywhere in the transconductance amplifier, VCE sensing or base drive circuits, or as otherwise known in the art. FIG. 17A also illustrates the provision of switch SW1 for CR. In the ON position, SW1 forms part of the VCE sensing pathway for accurately sensing the VCE of Q11. In the OFF position, SW1 preferably couples the input of the transconductance amplifier to a negative voltage supply or other reference below VTH1 that causes transconductance amplifier U1 to produce a negative base drive current that effectively turns off Q11, as in the circuit of FIGS. 15A–15B.

Note that it is possible to combine the advantages of the circuits of FIGS. 16–17, as will be discussed in subsequent circuits.

FIG. 18 is a more detailed schematic diagram of another embodiment of a BJT CR driving circuit in accordance with the present invention, which incorporates the accelerated turn-off principle illustrated in FIG. 16 in addition to the preferred inclusion of a single drive supply voltage. The embodiment of FIG. 18 utilizes a transconductance amplifier U5 (which provides an output current sink), and an offset current I-OS (from current source I1) coupled to the output of U5 which results in the desired VCEOS in the IB v. Q11 VCE relationship.

When SW1 is ON and the VCE of Q11 is below the VCEOS, the negative (or sink) current output of transconductance amplifier U5 is less than the offset current I-OS of current source I1. (Note that VCEOS is provided by I-OS and the transconductance characteristics of U5.) Under these conditions, the excess current from I1 flows into the emitter of Q21, whose base is preferably held at a bias voltage of approximately 0.915 volts (about 1.5 times the VBE of a silicon BJT, which provides a "dead band" between the conduction of Q21 and Q22) below the drive supply voltage V+ by voltage source V1 (V-BIAS). The Q21 collector current then drives the base of Q12 (or Q13, for 0<VCE<VCEOS), which holds CR Q11 in the "off" state. When the VCE of Q11 exceeds VCEOS, the U5 output current becomes greater than I-OS. This produces a reversed net current flow that turns off Q21 (and Q12 or Q13) and current begins to flow through the diode connected BJT Q22 and resistor R15 network. The relative currents in Q22 and Q24 are largely determined by the 10:1 resistance ratio of R15/R16, preferably increasing the transconductance gain of U5 by this same ratio. The positive base drive IB to Q11 is then proportional to (VCE–VCEOS) as desired. When the VCE of Q11 again falls below VCEOS, the Q24 drive current ceases and Q21 conducts, turning on the appropriate turn-off transistor Q12 (or Q13, when used for CR) and turning CR BJT Q11 quickly off, utilizing the principle discussed with reference to FIG. 16. With a V-BIAS voltage about 1.5 times the VBE of a BJT, Q12 (or Q13) and Q24 cannot simultaneously conduct, providing a small but definite VCE dead band between VCEOS (above which CR BJT Q11 is driven to conduct) and VTH1 (below which Q12 or Q13 is driven to conduct), and thereby turn Q11 off.

When SW1 is in the ON position, SW1 is part of the VCE sensing pathway, and Q11 functions as a SR. In the OFF position, SW1 couples the input to ground (or another reference less than VTH1) to thereby cause generation of a negative base drive current effectively turning-off Q11 (with VCE>0) by driving turn-off transistor Q13 instead of Q12, and the CR function is accomplished.

Figure 19:
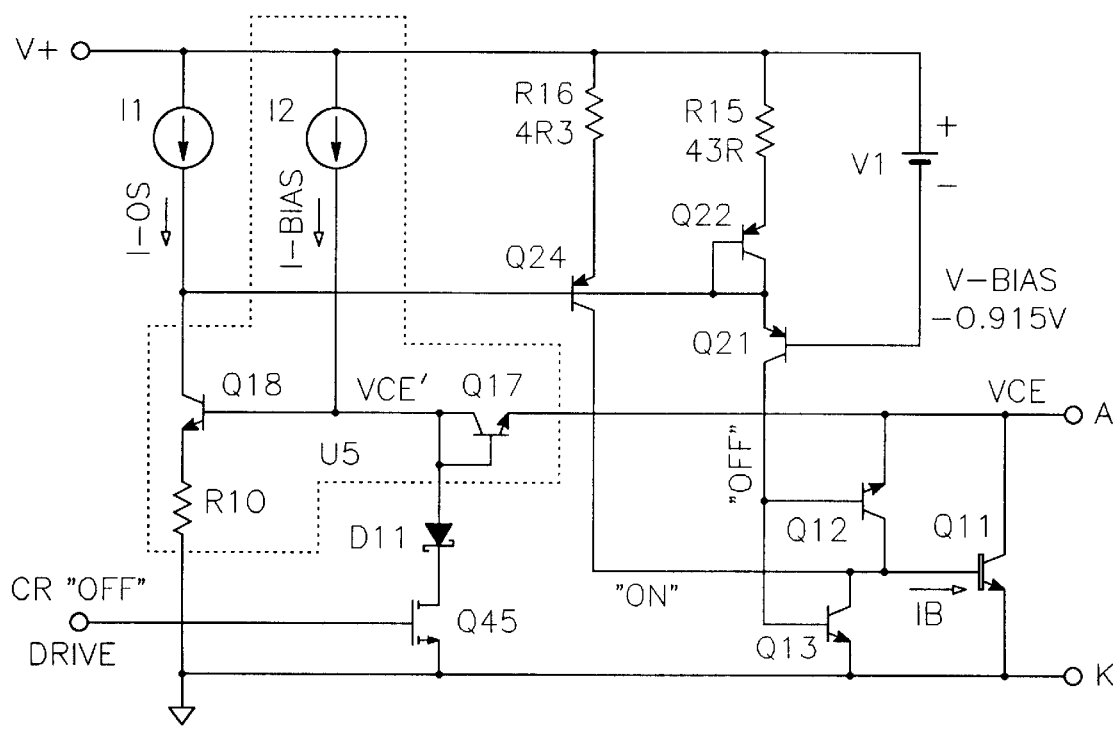

The circuitry of transconductance amplifier U5 and a functional equivalent of switch SW1 in FIG. 18 is shown in more detail in FIG. 19. Components I2, Q17, Q18 and R10 preferably comprise the transconductance amplifier U5 (shown in phantom lines) in the schematic of FIG. 19. A current source I2 provides a bias current (I-BIAS) to diode connected BJT Q17, whose emitter is connected to the collector of CR BJT Q11 and whose base is connected to the base of Q18. The base voltage of Q18 is VBE', which is higher than the VCE of Q11 by the VBE "diode drop" of Q17. The emitter of Q18 is in turn connected to the emitter of Q11 through resistor R10. Transistors Q18 and Q17 are configured to have matching characteristics and operate at similar currents so the VBE of Q18 closely matches, or in other words effectively compensates for, the "diode drop" or VBE of Q17. This compensation relates to temperature, process or otherwise induced variations. Similarly, Q17 compensates for the voltage drop induced by the VBE of Q18. Accordingly, the voltage "sensed" across R10 is essentially equal to the VCE of Q11 when VCE is positive, i.e., the sensing pathway is not corrupted by uncompensated semiconductor or PN junction voltage drops. The current in R10 (and current output of Q18) is thus proportional to the VCE of Q11 as required for a transconductance amplifier. Other methods of matching or compensating for the VBE of Q18 would include the more commonly used differential BJT pair, with coupled emitters and VCE inputs on the base terminals. A differential pair of FETs could also be used to sense the VCE of Q11, as discussed in Note 1 above.

FIG. 19 also illustrates the functional equivalent of switch SW1 implemented with an N-channel MOSFET Q45 that has a gate coupled to a CR "OFF" control signal source. (A Schottky diode D11 is preferably provided is series with switch transistor Q45, which prevents a large current flow through Q45 and Q17 when Q45 is on and the VCE of Q11 is negative.) Instead of disconnecting the transconductance amplifier input from the sensed VCE of Q11 to force Q11 off, turning on Q45 (with VCE>VCEOS) "shorts" VCE' to ground through Schottky diode D11. Since the D11 "diode drop" is about half of the VBE of Q18, the Q18 current is essentially zero (as if the VCE of Q11 were negative), which causes I-OS to drive turn-off transistor Q13 through Q21.

Figure 20:
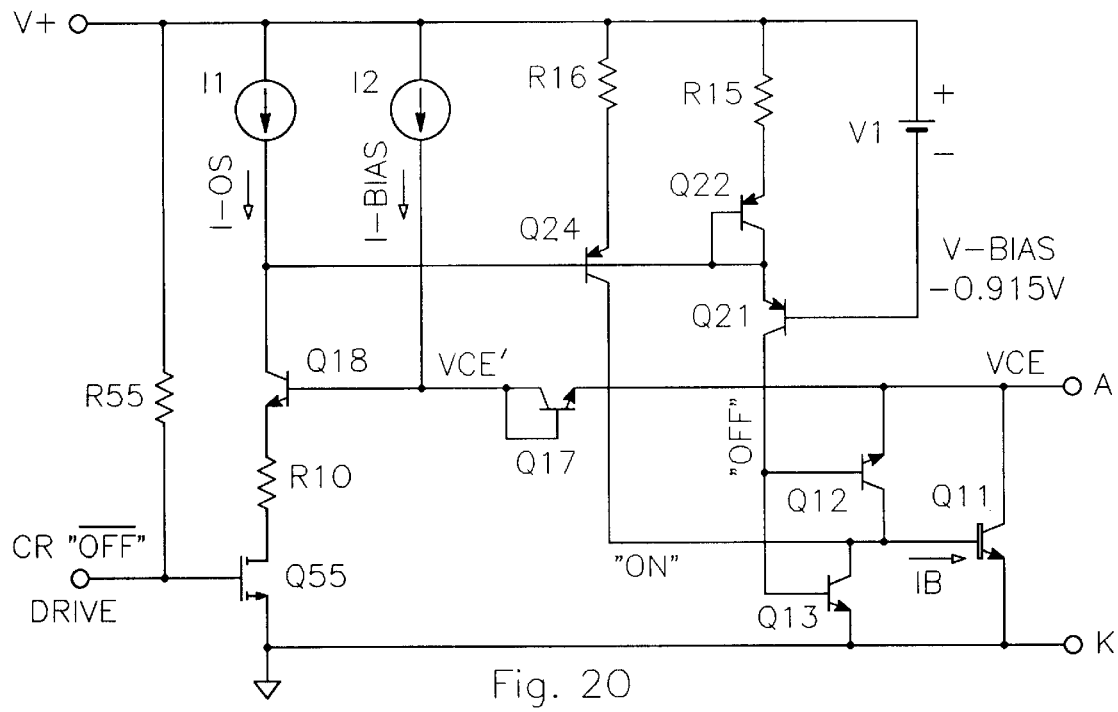
Figure 21:
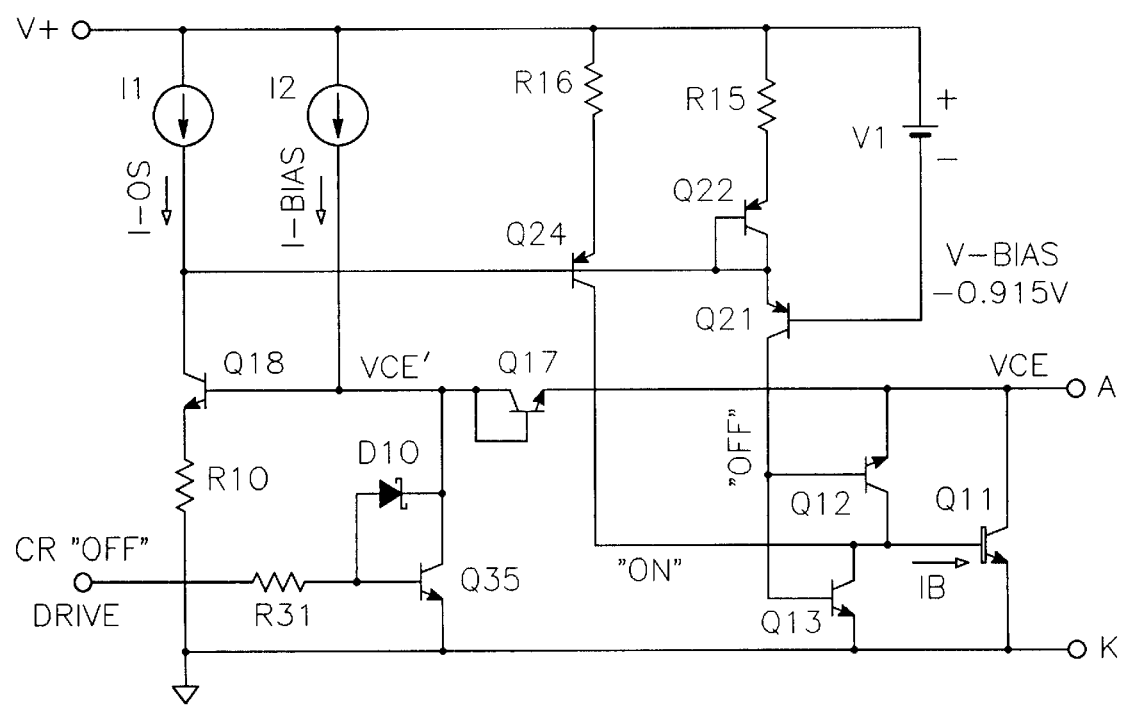

Referring to FIGS. 20–21, schematic diagrams of two CR BJT drive circuits similar to FIG. 19 with differing implementations of switch SW1 equivalents in accordance with the present invention are respectively shown. In FIG. 20, switch SW1 is implemented with a MOSFET transistor Q55 connected in series with R10. The gate of Q55 is preferably coupled to a CR OFF drive signal source and through resistor R55 to the voltage supply. Resistor R55 holds Q55 on in the absence of an (inverted) off drive signal, allowing current to flow through Q18 and R10, and operation is identical to that of FIG. 19 when Q45 is off. When the gate of Q55 is pulled low (typically to ground) it turns off, and prevents current flow in Q18 regardless of the VCE of Q11. This turns Q11 off in the same manner as in FIG. 19

In FIG. 21, the functional equivalent of switch SW1 is implemented with a BJT Q35 having a base connected through current forming resistor R31 to the CR Off drive signal source. When the CR "OFF" DRIVE is high, BJT Q35 turns on and "shorts" VCE' to ground the same manner as did Q45 in FIG. 19. A Schottky diode D10 is preferably coupled between the base and collector of Q35 to prevent deep saturation of Q35, which would slow the turn off of Q35 when the off drive command is removed. D10 also prevents "reverse" turn on of Q35 with an off drive command when the VCE of Q11 is negative. The principal advantage of the Q35 BJT implementation of FIG. 21 over that of the Q45 FET of FIG. 19 is that FETs are not always as readily integrateable into an otherwise exclusively bipolar transistor semiconductor chip.

Figure 22A:
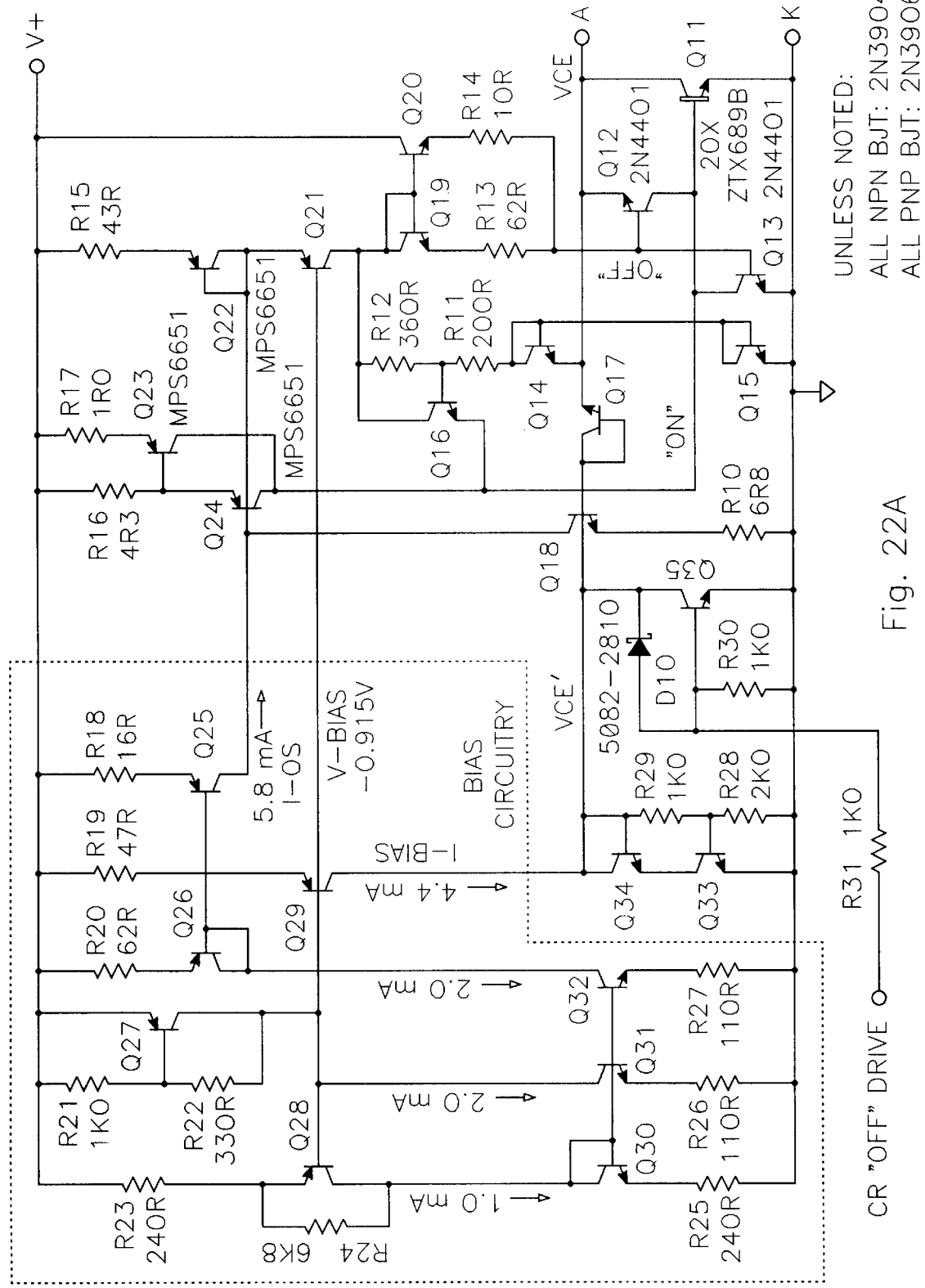
FIGS. 22A–22C is a detailed circuit diagram of an embodiment of the invention.

FIG. 22A illustrates a representative preferred implementation of a BJT CR drive circuit in accordance with the present invention, which incorporates the accelerated turn-off and turn-on principles of FIG. 16 and FIG. 17, respectively. The diagram is also a fully detailed circuit schematic, based on the simplified circuit of FIG. 21. Many of the components of the embodiment of FIG. 22A have their same function as identified in FIGS. 17, 18 and 21. The large part of the circuitry enclosed in the phantom lines and labeled "bias circuitry" functions to provide stable bias currents for I-BIAS and I-OS and to provide a bias voltage V-BIAS to the rest of the circuit. The design and functioning of suitable bias circuits are known in the art and hence bias circuits are not described further.

The BJT Q11 in the representative or prototype circuit of FIG. 22A may be any suitable BJT SR. Since BJTs are not commonly used as CRs, the embodiment of FIG. 22A was built and tested with a plurality of commercially available board-level BJTs arranged in parallel. In one embodiment, the plurality includes 20 matched Zetex ZTX689B transistors, provided in parallel and designed for conduction currents of up to 20–40 A (operating with a forced gain βf of around 140, and VCE about 140 mV at IC=20A). It should also be recognized that Q11 may be implemented as a large area discrete NPN (or PNP) BJT, as a discrete chip co-packaged with an integrated control circuit, or with the CR BJT Q11 integrated on the same chip as the control circuit, amongst other embodiments.

The use of turn-off transistors Q12, Q13 incorporates the accelerated turn-off principle of FIG. 16. The Q11 turn-off drive from Q21 to Q12, Q13 is further preferably amplified by a ratio, for example, of about 7:1 by transistors Q19 and Q20 and due primarily to the ratio of respective emitter resistors R13 and R14. Deep saturation of the turn-off transistor Q12 or Q13 is prevented by an anti-saturation circuit which preferably includes Q14, Q15, Q16, R11 and R12. The VBEs of all control circuit BJTs are preferably similar so that the sum of the voltages on resistors R11 and R12 is essentially the same as the sum of the VBE of BJT Q19 and the voltage on R13, or about 960 mV in this representative embodiment. The voltage on R11 is a little more than ⅓ of this sum, or about 340 mV. Since the VBE of BJTs Q14 and Q16 are similar, Q16 conducts and diverts "off" drive away from Q19 when SR BJT Q11 is essentially "off" and the VCE of Q12 or Q13 has fallen to about 340 mV. This also reduces the amplified drive current in Q20, and thereby reduces the overall turn-off drive current to Q12 an Q13 once Q11 is turned off.

When the VCE of Q11 rises to 160 mV (VTH2), the voltage on R16 is about 770 mV, causing Q23 to begin to conduct through resistor R17. Q23 has an effective emitter resistance of about 0.4 Ω so that when Q23 conducts the SR BJT Q11 base current increases about 4 times faster with VCE>160 mV (VTH2), as can be seen in the Q11 IB vs. VCE plots of FIGS. 22B and 22C. Thus, the accelerated turn-on principle shown in FIG. 17 is provided.

Figure 22B:
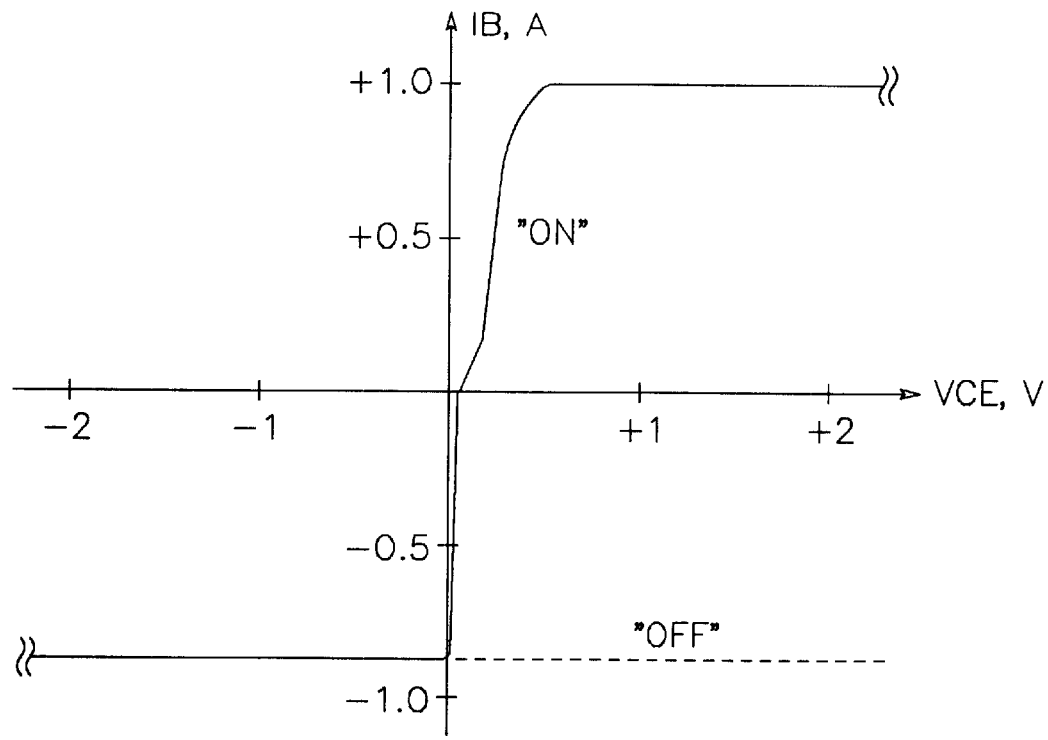
Figure 22C:
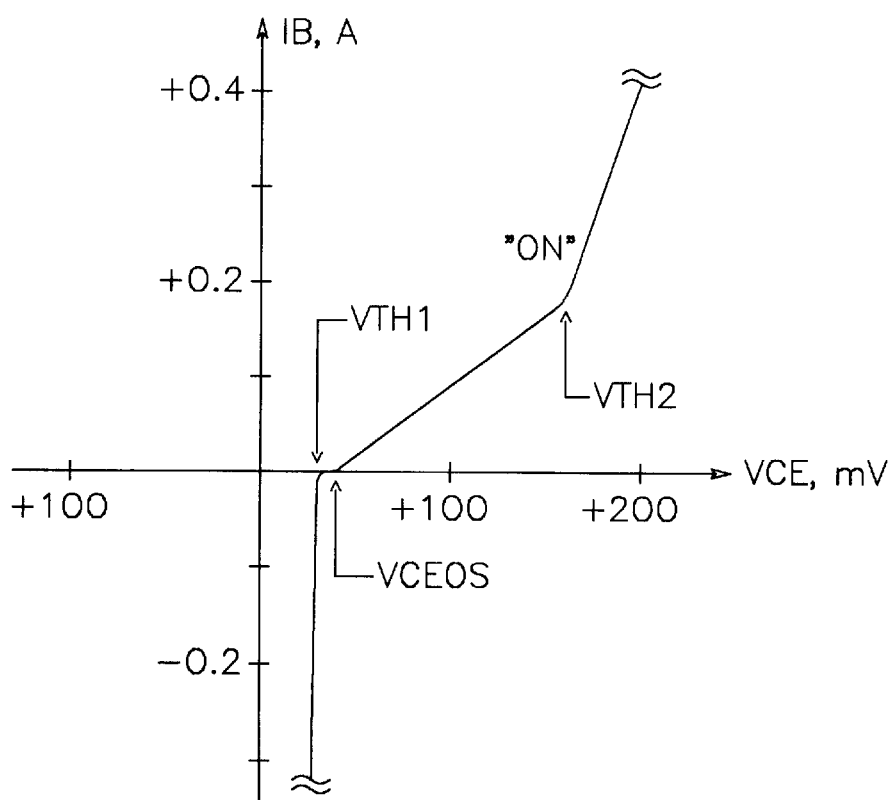

The large scale plot of FIG. 22B shows the Q11 base turn-off drive reaching about 800 mA as the VCE of Q11 approaches zero. In the small scale plot of IB vs. VCE in FIG. 22C, it can be seen that the VCEOS is about 40 mV when forward conduction commences and the drive transconductance increases at a voltage of about 160 mV (VTH2), corresponding to an IC of Q11 of about 24 A.

Transistors Q33, Q34 and resistors R28, R29 preferably form a voltage clamp at about 1.0 V on the base voltage of Q18 to limit peak drive currents in the control circuitry. This can be seen in FIG. 22B at a forward drive current of about 1 A. (This clamp circuit configuration also prevents significant reverse current flow when the VCE of Q11 is negative.)

FIG. 22A further illustrates switch SW1 being implemented with the transistor Q35 and diode D10 described with reference to FIG. 21. Resistor R31 is preferably coupled in series with the CR OFF drive signal, allowing a voltage drive signal to be used. Resistor R30 is coupled between the base of Q35 and signal common, or ground, to prevent leakage currents flowing in Q35 if the circuit is at a high temperature and the CR OFF drive input is left "open circuited" (not connected to a defined drive voltage). Resistors 30, 31 essentially function as a voltage divider until Q35 conducts, requiring a CR OFF drive signal above about 1.5V to turn Q11 off as a CR.

Note that, in this embodiment, the Q11 VCEOS is defined by the VCE required to produce sufficient current in Q18 and R10 to overcome the 5.8 mA I-OS current produced by Q25; the excess Q18 current turns on Q24 (at a rate determined by the "load" of diode connected Q22 and R15, and Q24 emitter resistor R16), which produces a Q11 base drive current proportional to VCE−VCEOS, as required by Equation 4. At a VCE slightly below VCEOS, Q24 turns off (removing Q11 base drive) and Q21 turns on, ultimately turning Q11 off through Q12 or Q13. The V-BIAS voltage of −0.915V is about 1.5 times the VBE of all BJTs in the drive circuit, so Q21 and Q22 cannot conduct simultaneously, although Q21 will begin to conduct very soon after Q22 (and Q24) turns off as the Q18 current drops below the 5.8 mA I-OS current; thus, VTH1 (where Q11 turn off begins) is slightly but definitely below VCEOS.

It should also be noted that FIG. 22A is merely representative of one embodiment of the present invention, and that many variations are possible which achieve the intent of the present invention. These alternatives include but are not limited to: changing the CR BJT to a PNP device; using semiconductor materials for the CR BJT and/or CR control and drive circuit other than silicon (such as Ge, GaAs, SiGe, SiC, GaN, etc.); using MOSFETs or JFETs instead of some or all of the BJTs in the control and drive circuit; and other control and drive circuit alternatives which achieve the desired properties of fast CR turn-on, optimal "on" drive with IB accurately and stably proportional to VCE−VCEOS over a range of operating temperatures, and fast turn-off with a CR VCE of either polarity, in a circuit which does not use transformers for CR driving and/or current sensing.

FIGS. 23–26 illustrate several practical applications for controlled rectification. For these illustrations, it is assumed that the CR BJT and control circuit have been integrated or co-packaged as a self-driven controlled rectifier "device" with at least four terminals, designated variously as CR1, CR2, CR10 and CR11 in the figures. The CR terminals are the anode A, cathode K (indicating their functional equivalence to diode rectifiers), supply voltage V+, and "mode" control or drive-off input DR. A CR device may include all of the circuitry in FIG. 22A, as an example. (If the SR BJT were a PNP device, the supply voltage would be negative (V−) relative to the emitter of the SR BJT.)

Figure 23:
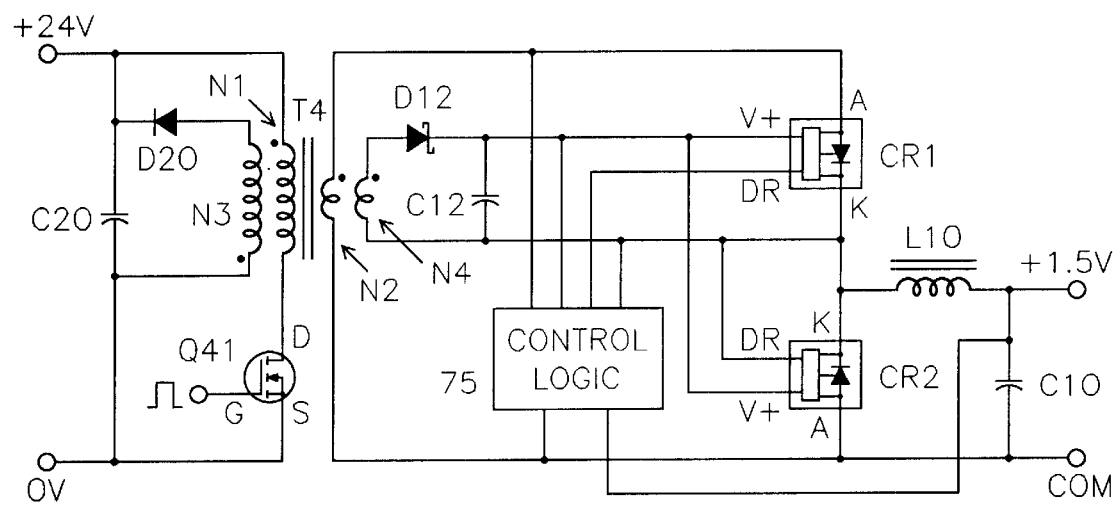
FIGS. 23–26 illustrate representative applications for a CR.
Figure 24:
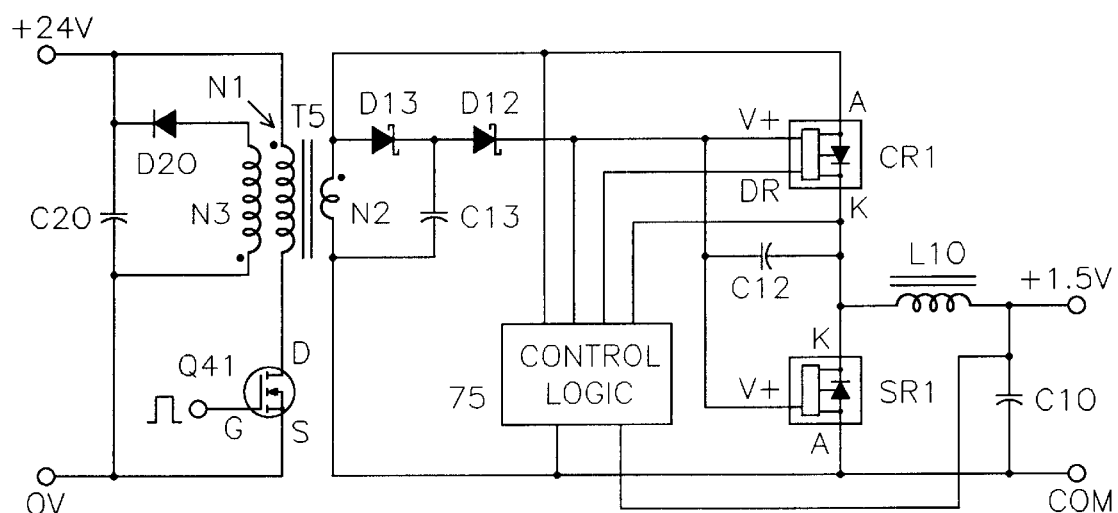
Figure 25:
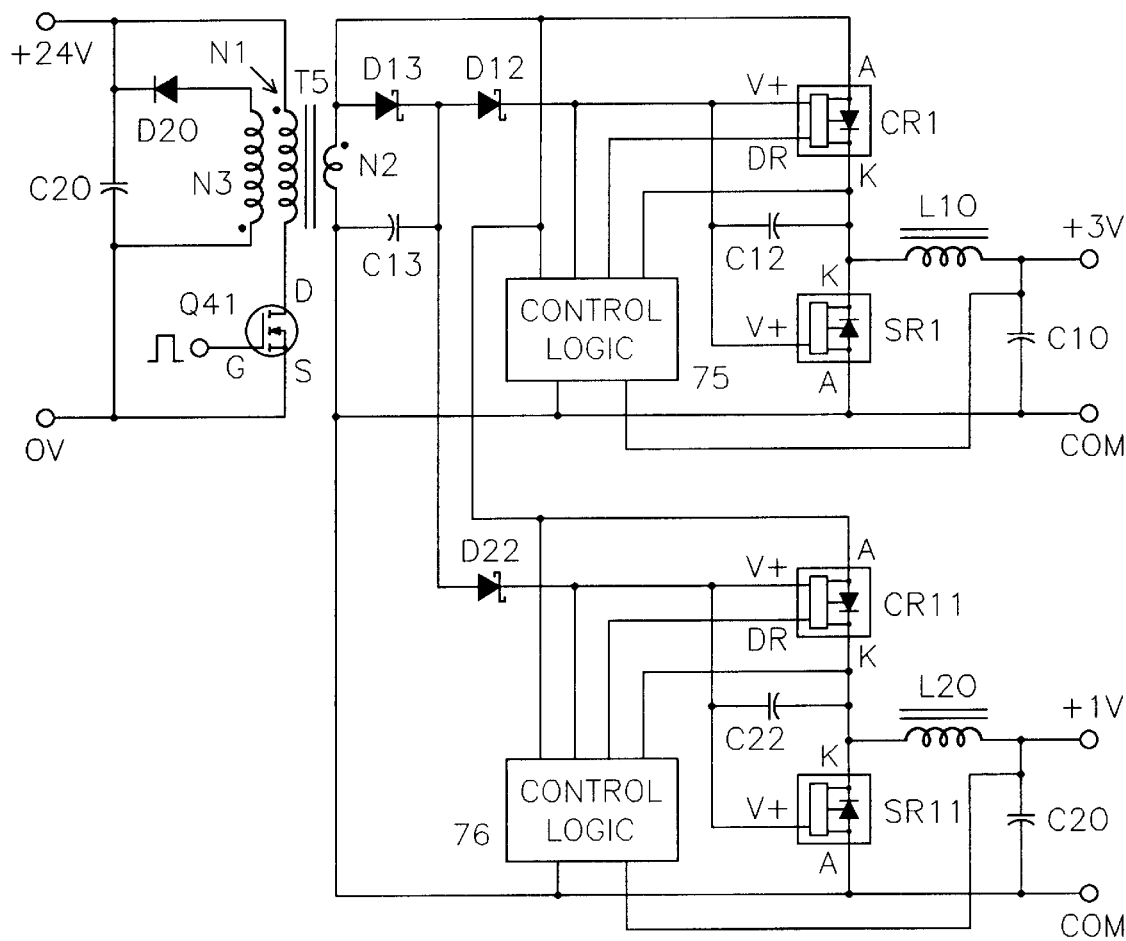

FIGS. 23–25 illustrate a representative a single ended (or "half wave") forward converter. The converter is provided for illustrative purposes and it should be recognized that controlled rectification may be used with nearly any converter topology without departing from the present invention. In these circuits, a primary transistor Q41 is alternatively turned off and on (by a control and drive circuit which is not shown) to energize the primary winding N1 of transformer T4. The magnetizing energy stored in T4 when Q41 is on is returned to the +24V DC input supply when Q41 is off through winding N3 and diode D20. The AC voltage on T4 output winding N2 is conventionally rectified to a pulsating DC voltage by diodes (in the place of CR1, CR2 in FIG. 23), which is then "averaged" to a nearly constant DC voltage by the L10-C10 filter.

FIG. 23 illustrates the use of controlled rectification as discussed above with respect to FIGS. 15–22. The controlled rectifiers are designated CR1 and CR2. For CRs using NPN BJT power transistors, the BJT emitter and collector become the cathode "K" and anode "A" respectively of the CR, as shown in the symbols CR1 and CR2 in FIG. 23, which preferably have a common cathode connection to filter inductor L10. (For a CR using a PNP BJT, the BJT emitter and collector become the anode and cathode, respectively.) The CR also requires a V+ voltage supply input and an OFF drive input DR.

The V+ supply voltage for both CRs in FIG. 23 is preferably produced by a fourth T4 winding N4, which is rectified to DC by diode D12 and storage capacitor C12. Without turn-off drive commands on the DR input, both CR1 and CR2 behave as synchronous rectifiers, and operation would be that of a conventional converter with the higher efficiency advantages of synchronous rectification. In this mode, CR1 would conduct (with CR2 off) when Q41 is on and the N2 voltage is positive, and CR2 would conduct (with CR1 off) when Q41 is off and the N2 voltage is negative.

Voltage regulation would be achieved by varying the conduction duty cycle of Q41.

With controlled rectification, however, the conduction duty cycle of Q41 can be fixed or may vary in a predetermined manner (varying inversely with input voltage, for example, to keep the conduction "volt-seconds" constant on the T4 windings). The control logic 75 may then drive CR1 off for part of the time Q41 is on (during which CR2 conducts) to regulate the sensed +1.5V output voltage. CR1 may be turned on and off at any time Q41 is on and a positive voltage exists on winding N2. The fastest control occurs when CR1 turns on as the N2 voltage rises, with "trailing edge" modulation of the CR1 turn off time.

In FIG. 23, CR2 is not required to be a CR, so the drive DR input is simply "grounded" to the cathode K, allowing CR2 to function solely as an SR.

The circuit of FIG. 24 is similar to that of FIG. 23 but with modifications. First, CR2 has been replaced with a synchronous rectifier SR1, as controlled rectification is not required of this device. Second, the need for winding N4 on T4 has been eliminated by the use of an additional diode (D13) and capacitor (C13), which peak rectify the positive voltage on winding N2. The voltage on C13 then charges CR/SR drive storage capacitor C12 when SR1 is conducting. (When power is first applied to the circuit, C12 is initially charged through D12 and L10 to the "zero" output voltage.)

The circuit of FIG. 25 is in turn similar to that of FIG. 24, except that now two independently regulated output voltages (+3V and +1V, in this example) are obtained from the same winding by adding a second output circuit, consisting of D22, C22, CR11, SR11, L20, C20 and another control circuit control logic 76. In principle, any number of outputs can be regulated from the same transformer output winding by adding controlled rectifiers, filters, logic and other support circuitry as illustrated and as known.

A CR is a highly flexible device that can be used in a wide variety of applications. Besides controlled rectification and synchronous rectification (shown in FIG. 23), the device can also serve as an optimally driven BJT transistor, where the VCE of the CR BJT is always positive.

Figure 26:
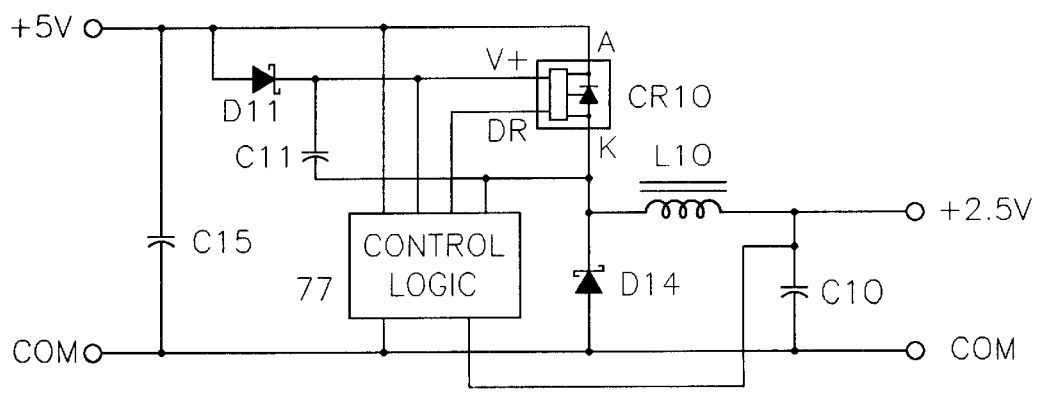

An example of a CR used as a conventional transistor is shown in FIG. 26, where CR10 becomes the "top side" transistor in an illustrative and transformerless +5V to +2.5V buck regulator. The CR supply voltage (V+) is derived from the input by charging C11 through D11 when CR10 is off, as occurred in the circuit of FIG. 24. The control logic 77 then turns "transistor" CR1 on and off to regulate the output voltage on A controlled rectifier could also be used as the input side transistor in an isolated converter if the input voltage were not too high. If the input voltage to the DC—DC converter of FIG. 23 were 2.4V instead of 24V (as might be supplied by a battery or a solar cell, for example), then transistor Q41 could be replaced by a CR serving as a transistor. The principle advantage of this utilization of a BJT CR as a transistor is that the low conduction voltage drop of a BJT is realized (as opposed to a similar MOSFET), while the problems of optimally driving a BJT are solved by the "built in" CR drive and control logic.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A circuit for driving a bipolar junction transistor (BJT) used as a controlled rectifier (CR), comprising:
   a mode signal input;
   a drive circuit coupled to said mode signal input and having an input adapted for coupling to the collector and emitter of a BJT CR and an output adapted for coupling to the base of that BJT CR, said drive circuit including a sensing pathway for sensing the collector to emitter voltage (VCE) of that BJT CR and being configured to produce a CR BJT base drive current (IB) at said output and to operate in at least a first and a second mode of operation based on the state of a signal at said mode signal input;
   wherein in said first mode, said drive circuit senses VCE and generates, when the sensed VCE is greater than an offset value, a positive base drive current that is at least in part proportional to the sensed VCE minus said offset value, and wherein in said second mode, said drive circuit produces a base drive current to turn-off that BJT CR.

2. The circuit of claim 1, wherein said drive circuit includes an electronic device that is configured to achieve a switch function between at least a first state and a second state, and the electronic device is controlled by a signal at said mode signal input, said first state resulting in said first mode of operation and said second state resulting in said second mode of operation.

3. The circuit of claim 2, wherein said electronic device includes a MOSFET, a JFET or a BJT.

4. The circuit of claim 3, wherein said electronic device further includes a Schottky diode provided herewith.

5. The circuit of claim 1, wherein said drive circuit is further configured to enhance production of a negative base drive current when a sensed VCE is below a first threshold.

6. The circuit of claim 1, wherein said drive circuit is further configured to enhance production of said positive base drive current when a sensed VCE is above a second threshold and said drive circuit is operating in said first mode.

7. The circuit of claim 1, wherein said drive circuit includes circuitry to generate said offset value.

8. The circuit of claim 7, wherein said offset value generating circuitry provides at least one of the functions of:
   inducing an imbalance in said sensing pathway; or
   inducing a variation in the base drive current produced by said drive circuit that approximates the effect of having an imbalance in said sensing pathway,
   to generate, at least in part, said offset value.

9. The circuit of claim 1, wherein said sensing pathway is configured such that a VCE sensed through said pathway varies approximately 1.8 mV or less per change in degree C.

10. The circuit of claim 1, wherein said sensing pathway is configured such that a VCE sensed through said pathway varies approximately 1.5 mV or less per change in degree C.

11. The circuit of claim 1, wherein said sensing pathway is configured such that a VCE sensed through said pathway varies approximately 1 mV or less per change in degree C.

12. The circuit of claim 1, wherein said driving circuit is provided within a DC to DC converter.

13. The circuit of claim 1, wherein said driving circuit is provided within a regulator.

14. The circuit of claim 1, wherein said drive circuit is powered by a single supply voltage.

15. The circuit of claim 1, further including control logic for generating a control signal to said mode signal input, said control logic being powered by a single supply voltage.

16. A circuit for driving a bipolar junction transistor (BJT) used as a controlled rectifier (CR), comprising:
   a mode signal input;
   a drive circuit coupled to said mode signal input and having inputs adapted for coupling to the collector and emitter of a BJT CR and an output adapted for coupling to the base of that BJT CR, said drive circuit including a sensing pathway for sensing the collector to emitter voltage (VCE) of that BJT CR and being configured to operate in at least a first and a second mode of operation;
   wherein, in said first mode, said drive circuit drives the BJT CR as a synchronous rectifier and in said second mode, said drive circuit effectively turns-off the BJT CR.

17. The circuit of claim 16, wherein said drive circuit includes a transconductance amplifier.

18. The circuit of claim 16, wherein said drive circuit includes an electronic device that is configured to achieve a switch function between at least a first state and a second state, and the electronic device is controlled by a signal at said mode signal input, said first state resulting in said first mode of operation and said second state resulting in said second mode of operation.

19. The circuit of claim 18, wherein said electronic device further includes a Schottky diode provided herewith.

20. The circuit of claim 16, wherein said drive circuit is further configured to enhance production of a negative base drive current when a sensed VCE is below a first threshold.

21. The circuit of claim 16, wherein said drive circuit is further configured to enhance production of said positive base drive current when a sensed VCE is above a second threshold and said drive circuit is operating in said first mode.

22. The circuit of claim 16, wherein said drive circuit includes circuitry that provides at least one of the functions of:
   inducing an imbalance in said sensing pathway; or
   inducing a variation in the base drive current produced by said drive circuit that approximates the effect of having an imbalance in said sensing pathway,
   to generate, at least in part, said offset value.

23. The circuit of claim 16, wherein said sensing pathway is configured such that a VCE sensed through said pathway varies approximately 1.5 mV or less per change in degree C.

24. The circuit of claim 16, wherein said sensing pathway is configured such that a VCE sensed through said pathway varies approximately 1 mV or less per change in degree C.

25. The circuit of claim 1, wherein said drive circuit is powered by a single supply voltage.

26. A circuit for driving a bipolar junction transistor (BJT) used as a controlled rectifier (CR), comprising:
   a drive circuit having an input adapted for coupling to the collector and emitter of a BJT CR and an output adapted for coupling to the base of that BJT CR, said drive circuit including a sensing pathway for sensing the collector to emitter voltage (VCE) of that BJT CR;
   an electronic device coupled to said drive circuit that is configured to achieve a switch function having at least a first state and a second state;

in said first state, said drive circuit drives that BJT CR as a synchronous rectifier and in said second state, said drive circuit effectively turns off that BJT CR.

27. The circuit of claim 26, wherein said drive circuit is configured to produce a base drive current for that BJT CR, and further configured to perform at least one of enhancing production of a positive base drive current when a sensed VCE is above a first threshold or enhancing the production of a negative base drive current when a sensed VCE is below a second threshold.

28. The circuit of claim 26, wherein said drive circuit includes circuitry that provides at least one of the functions of:

inducing an imbalance in said sensing pathway; or inducing a variation in the base drive current produced by said drive circuit that approximates the effect of having an imbalance in said sensing pathway, to generate, at least in part, said offset value.

29. The circuit of claim 26, wherein said sensing pathway is configured such that a VCE sensed through said pathway varies approximately 1 mV or less per change in degree C.

30. The circuit of claim 26, wherein said drive circuit is powered by a single supply voltage.

* * * * *